(12) United States Patent
Bluck et al.

(10) Patent No.: US 10,062,600 B2
(45) Date of Patent: Aug. 28, 2018

(54) SYSTEM AND METHOD FOR BI-FACIAL PROCESSING OF SUBSTRATES

(71) Applicant: Intevac, Inc., Santa Clara, CA (US)

(72) Inventors: Terry Bluck, Santa Clara, CA (US); Vinay Shah, San Mateo, CA (US); Ian Latchford, Palo Alto, CA (US); Alexandru Riposan, Palo Alto, CA (US)

(73) Assignee: Intevac, Inc., Santa Clara, CA (US)

( * ) Notice: Subject to any disclaimer, the term of this patent is extended or adjusted under 35 U.S.C. 154(b) by 452 days.

(21) Appl. No.: 14/627,667

(22) Filed: Feb. 20, 2015

(65) Prior Publication Data

US 2015/0170947 A1 Jun. 18, 2015

Related U.S. Application Data

(63) Continuation-in-part of application No. 13/871,871, filed on Apr. 26, 2013.
(Continued)

(51) Int. Cl.
*H01L 21/677* (2006.01)
*H01L 21/687* (2006.01)
*H01L 21/67* (2006.01)

(52) U.S. Cl.
CPC .. *H01L 21/68785* (2013.01); *H01L 21/67173* (2013.01); *H01L 21/67736* (2013.01); *H01L 21/67754* (2013.01)

(58) Field of Classification Search
CPC .................. H01L 21/67201; B65G 2201/02
(Continued)

(56) References Cited

U.S. PATENT DOCUMENTS 3,498,711 A 3/1970 Ables et al.
3,775,644 A 11/1973 Cotner et al.
(Continued)

FOREIGN PATENT DOCUMENTS

CN 1662978 A 8/2005
CN 1818719 A 8/2006
(Continued)

OTHER PUBLICATIONS

Notice of Allowance in Taiwanese Patent Application No. 102113908 dated Sep. 30, 2015.
(Continued)

*Primary Examiner* — Saul Rodriguez
*Assistant Examiner* — Willie Berry, Jr.
(74) *Attorney, Agent, or Firm* — Womble Bond Dickinson (US) LLP; Joseph Bach, Esq.

(57) ABSTRACT

A system for processing substrates in plasma chambers, such that all substrates transport and loading/unloading operations are performed in atmospheric environment, but processing is performed in vacuum environment. The substrates are transported throughout the system on carriers. The system's chambers are arranged linearly, such that carriers move from one chamber directly to the next. A conveyor, placed above or below the system's chambers, returns the carriers to the system's entry area after processing is completed. The carriers are configured for supporting substrates of different sizes. The carriers are also configured for flipping the substrates such that both surfaces of the substrates may be processed.

21 Claims, 19 Drawing Sheets

Related U.S. Application Data

(60) Provisional application No. 61/942,594, filed on Feb. 20, 2014, provisional application No. 61/943,999, filed on Feb. 24, 2014, provisional application No. 61/639,052, filed on Apr. 26, 2012.

(58) Field of Classification Search
USPC ... 198/465.3, 867.15, 867.14, 803.2, 803.11; 414/217, 939
See application file for complete search history.

(56) References Cited

U.S. PATENT DOCUMENTS

| | | | |
|---|---|---|---|
| 4,475,223 | A | 10/1984 | Taniguchi et al. |
| 4,599,970 | A | 7/1986 | Peterson |
| 4,699,555 | A | 10/1987 | Guarino |
| 4,913,789 | A | 4/1990 | Aung |
| 4,915,057 | A | 4/1990 | Boudreau et al. |
| 4,915,564 | A | 4/1990 | Eror et al. |
| 5,164,974 | A | 11/1992 | Kariya et al. |
| 5,567,267 | A | 10/1996 | Kazama et al. |
| 5,688,389 | A | 11/1997 | Bjornard et al. |
| 5,846,328 | A | 12/1998 | Aruga et al. |
| 5,993,614 | A | 11/1999 | Nomura |
| 6,083,566 | A | 7/2000 | Whitesell |
| 6,084,494 | A | 7/2000 | Chew et al. |
| 6,146,489 | A | 11/2000 | Wirth |
| 6,251,232 | B1 | 6/2001 | Aruga et al. |
| 6,291,114 | B1 | 9/2001 | Reijers |
| 6,475,287 | B1 | 11/2002 | Clark |
| 6,589,382 | B2 | 7/2003 | Clark et al. |
| 7,220,173 | B2 * | 5/2007 | Kim .............. H01L 21/68785 198/867.14 |
| 7,429,300 | B2 | 9/2008 | Kido et al. |
| 7,785,663 | B2 | 8/2010 | Kido et al. |
| 8,261,905 | B2 * | 9/2012 | Kholodenko ..... H01L 21/67706 198/467.1 |
| 8,349,196 | B2 | 1/2013 | Fairbairn et al. |
| 8,378,318 | B1 | 2/2013 | Gammel et al. |
| 9,082,799 | B2 | 7/2015 | Weaver et al. |
| 2002/0011406 | A1 | 1/2002 | Shishido et al. |
| 2002/0179013 | A1 | 12/2002 | Kido et al. |
| 2002/0187265 | A1 | 12/2002 | Mori et al. |
| 2003/0074097 | A1 | 4/2003 | Mautz et al. |
| 2003/0087471 | A1 | 5/2003 | Shtein et al. |
| 2003/0108805 | A1 | 6/2003 | Clark |
| 2003/0221614 | A1 | 12/2003 | Kang et al. |
| 2004/0020435 | A1 | 2/2004 | Tsuchiya et al. |
| 2004/0037732 | A1 | 2/2004 | Shiga et al. |
| 2004/0049308 | A1 | 3/2004 | Evers et al. |
| 2004/0115342 | A1 | 6/2004 | Shigemura |
| 2004/0168634 | A1 | 9/2004 | Mori et al. |
| 2005/0034673 | A1 | 2/2005 | Kim |
| 2005/0232734 | A1 | 10/2005 | Elliott et al. |
| 2006/0150910 | A1 | 6/2006 | Han et al. |
| 2006/0187431 | A1 | 8/2006 | Shibazaki |
| 2006/0201618 | A1 | 9/2006 | Kang et al. |
| 2006/0266718 | A1 | 11/2006 | Tischner et al. |
| 2007/0009671 | A1 | 1/2007 | Manz |
| 2008/0299296 | A1 | 12/2008 | Kido et al. |
| 2009/0003977 | A1 * | 1/2009 | Aburatani ......... H01L 21/67109 414/217 |
| 2009/0016857 | A1 | 1/2009 | Nakamura |
| 2009/0017192 | A1 | 1/2009 | Matsuura |
| 2009/0145879 | A1 | 6/2009 | Fairbairn et al. |
| 2009/0179651 | A1 | 7/2009 | Elgar et al. |
| 2009/0185892 | A1 | 7/2009 | Aburatani |
| 2009/0194026 | A1 | 8/2009 | Burrows et al. |
| 2009/0250574 | A1 | 10/2009 | Fullerton et al. |
| 2009/0291610 | A1 | 11/2009 | Sasaki |
| 2009/0324379 | A1 | 12/2009 | He et al. |
| 2010/0003768 | A1 | 1/2010 | Barnes et al. |
| 2010/0092668 | A1 | 4/2010 | Hegedus |
| 2010/0111650 | A1 | 5/2010 | Quach et al. |
| 2010/0120233 | A1 | 5/2010 | He |
| 2010/0296903 | A1 | 11/2010 | Shah et al. |
| 2011/0075145 | A1 | 3/2011 | Dohse |
| 2011/0141448 | A1 | 6/2011 | Aoki et al. |
| 2011/0174217 | A1 | 7/2011 | Gersdorff et al. |
| 2011/0207261 | A1 | 8/2011 | Watai et al. |
| 2011/0234344 | A1 | 9/2011 | Fullerton et al. |
| 2012/0006257 | A1 | 1/2012 | Higashisaka et al. |
| 2012/0048186 | A1 | 3/2012 | Bruning et al. |
| 2012/0170999 | A1 | 7/2012 | Sakaue |
| 2012/0199477 | A1 | 8/2012 | Uenosono |
| 2013/0071208 | A1 | 3/2013 | Hosek |
| 2013/0176691 | A1 | 7/2013 | Stevens et al. |
| 2013/0276978 | A1 | 10/2013 | Bluck et al. |
| 2013/0287526 | A1 | 10/2013 | Bluck et al. |
| 2016/0042913 | A1 | 2/2016 | Adibi et al. |

FOREIGN PATENT DOCUMENTS

| | | |
|---|---|---|
| CN | 1861833 A | 11/2006 |
| CN | 101864552 A | 10/2010 |
| CN | 102165095 A | 8/2011 |
| CN | 104582863 A | 4/2015 |
| CN | 104685095 A | 6/2015 |
| DE | 102008037387 A1 | 3/2010 |
| EP | 1365040 A1 | 11/2003 |
| EP | 2423350 A1 | 2/2012 |
| EP | 2839052 A1 | 2/2015 |
| EP | 2852469 A1 | 4/2015 |
| JP | 2000-048954 A | 2/2000 |
| JP | 2000-173769 A | 6/2000 |
| JP | 2001-49422 A | 2/2001 |
| JP | 2001-110567 A | 4/2001 |
| JP | 2001-203079 A | 7/2001 |
| JP | 2001-247961 A | 9/2001 |
| JP | 2001-273979 A | 10/2001 |
| JP | 2002-8859 A | 1/2002 |
| JP | 2002-9098 A | 1/2002 |
| JP | 2004-214185 A | 7/2004 |
| JP | 2015-520799 A | 7/2015 |
| JP | 2015-521373 A | 7/2015 |
| KR | 10-2015-0051935 A | 5/2015 |
| KR | 10-2015-0053733 A | 5/2015 |
| TW | 569284 B | 1/2004 |
| TW | I229916 B | 3/2005 |
| TW | I343087 B | 6/2011 |
| TW | 201130929 A | 9/2011 |
| TW | I356467 B | 1/2012 |
| TW | 201349384 A | 12/2013 |
| TW | 201401412 A | 1/2014 |
| TW | 201541546 A | 11/2015 |
| TW | I518832 B | 1/2016 |
| TW | I518839 B | 1/2016 |
| TW | 201606921 A | 2/2016 |
| WO | 99/61678 A1 | 12/1999 |
| WO | 2011024853 A1 | 3/2011 |
| WO | 2013159050 A1 | 10/2013 |
| WO | 2013163622 A1 | 10/2013 |
| WO | 2015/127191 A1 | 8/2015 |
| WO | 2016/022728 A1 | 2/2016 |

OTHER PUBLICATIONS

Office Action for Chinese Patent Application No. 201380033430.7 dated Oct. 23, 2015.
Notice of Allowance in Taiwanese Patent Application No. 102114999 dated Oct. 16, 2015.
International Search Report and Written Opinion for PCT/US2015/043884 dated Oct. 23, 2015.
Office Action in U.S. Appl. No. 13/866,856 dated Feb. 2, 2016.
Office Action in Chinese Patent Application No. 201380026127.4 dated Mar. 3, 2016.
Office Action in U.S. Appl. No. 13/871,871 dated Jan. 21, 2016.
Office Action in U.S. Appl. No. 14/819,402 dated Feb. 5, 2016.
Notice of Allowance in U.S. Appl. No. 13/866,856 dated Aug. 11, 2016.
Notice of Allowance in U.S. Appl. No. 13/871,871 dated Jun. 17, 2016.

(56) References Cited

OTHER PUBLICATIONS

Notice of Allowance in U.S. Appl. No. 14/819,402 dated Jun. 14, 2016.
Office Action in U.S. Appl. No. 13/871,871 dated Aug. 28, 2015.
Extended Search Report for European Patent Application No. 13780965.3 dated Aug. 3, 2015.
Search and Examination Report for Singapore Patent Application No. 11201406893X dated Aug. 18, 2015.
Examination Report in Taiwanese Patent Application No. 102114999 dated Jul. 29, 2015.
Invitation to Pay Additional Fees for PCT/US2015/016799 dated Apr. 22, 2015.
International Search Report and Written Opinion for PCT/US2015/016799 dated Jun. 26, 2015.
Office Action in U.S. Appl. No. 13/866,856 dated Nov. 6, 2014.
Office Action in U.S. Appl. No. 13/866,856 dated Jun. 5, 2015.
Office Action in U.S. Appl. No. 13/871,871 dated Dec. 5, 2014.
International Search Report and Written Opinion in PCT Application No. PCT/US2013/037464, dated Sep. 6, 2013.
International Preliminary Report on Patentability in PCT Application No. PCT/US2013/037464, dated Sep. 11, 2014.
First Examination and Search Report in Taiwanese Patent Application No. 102113908 dated Apr. 30, 2015.
International Search Report and Written Opinion in PCT Application No. PCT/US2013/038530, dated Aug. 16, 2013.
International Preliminary Report on Patentability in PCT Application No. PCT/US2013/038530, dated Nov. 6, 2014.
Fiepke, J. W., "Permanent Magnet Materials," ASM Handbook vol. 2: Properties and Selection: Nonferrous Alloys and Special-Purpose Materials, (1990) ASM International. pp. 782-803.
Carpenter Technology Corporation, KOVAR® Alloy Technical Data Sheet, 1990.

\* cited by examiner

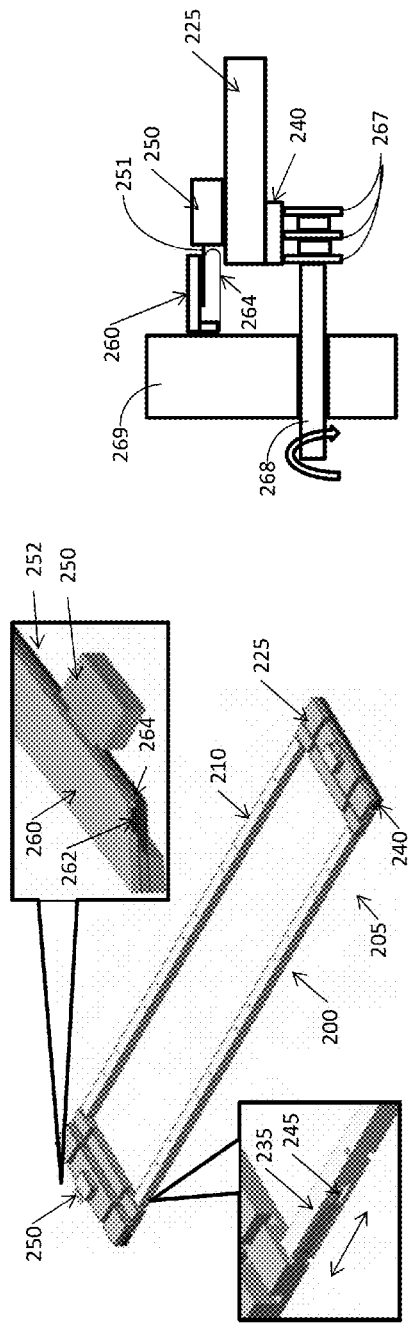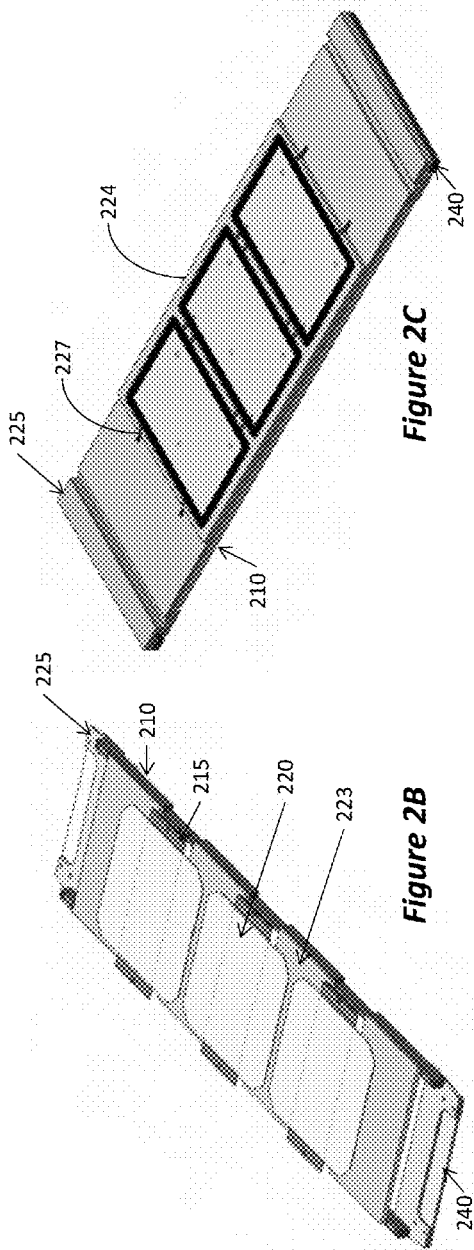

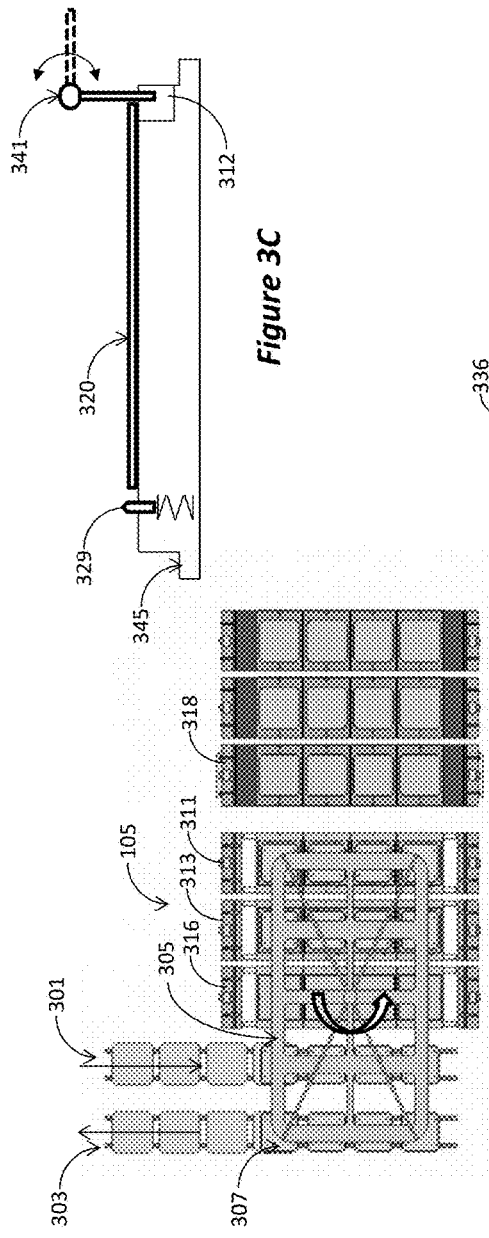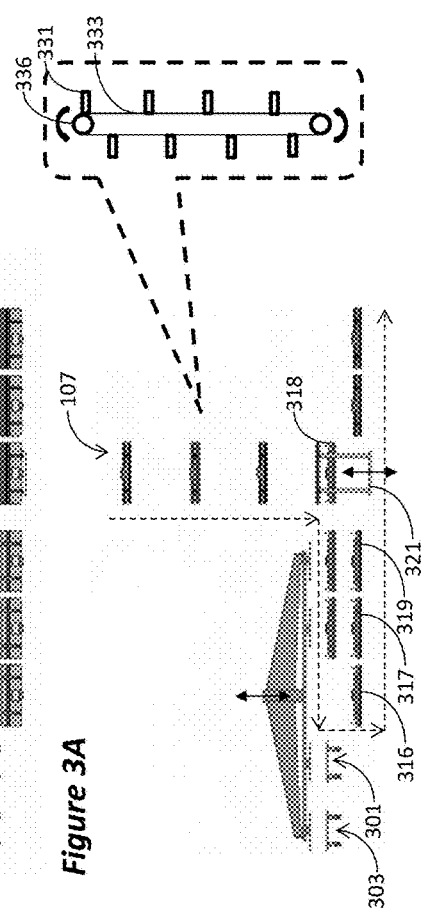

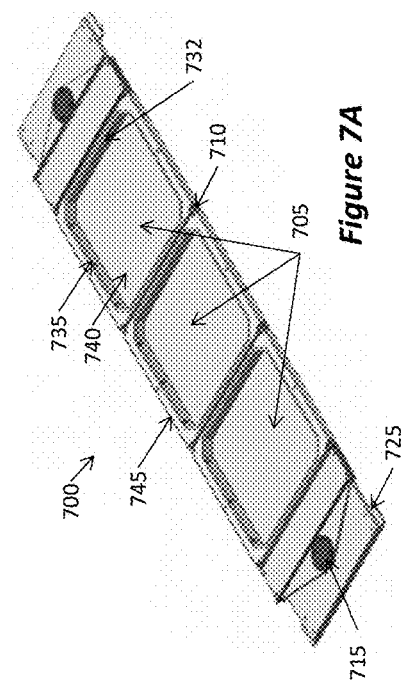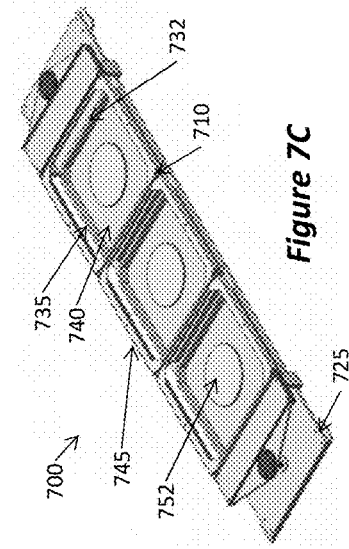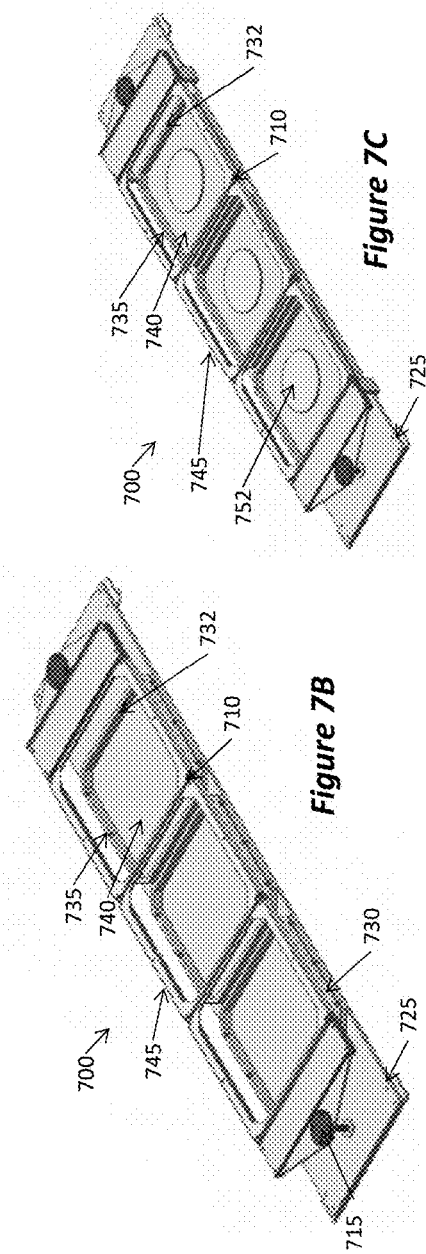

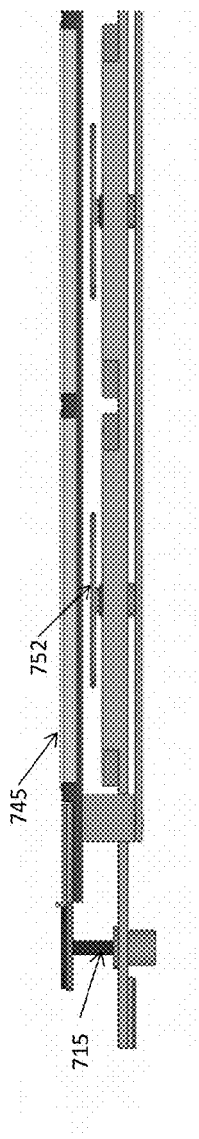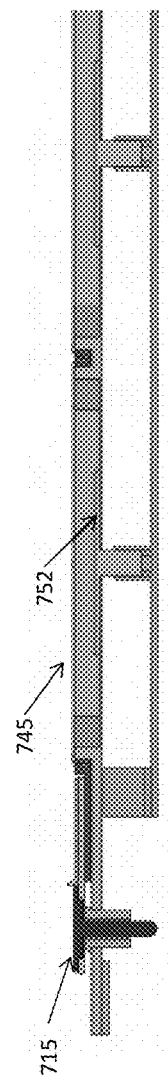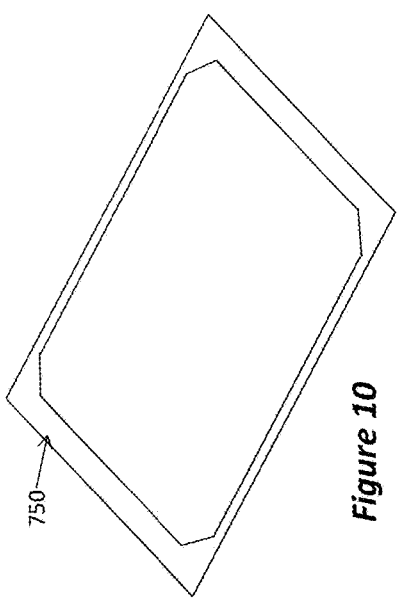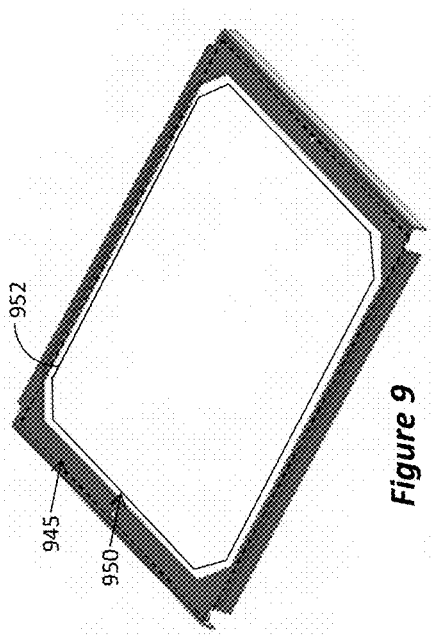

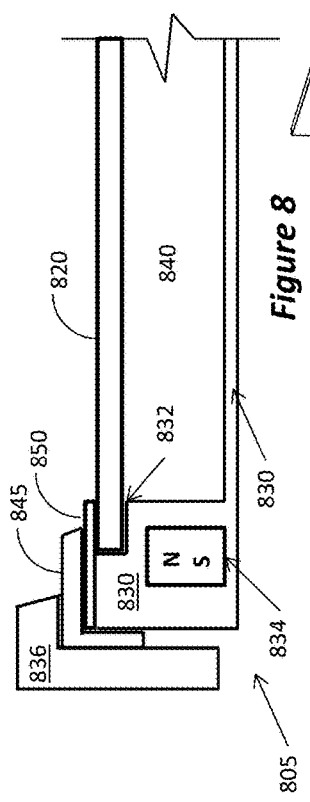
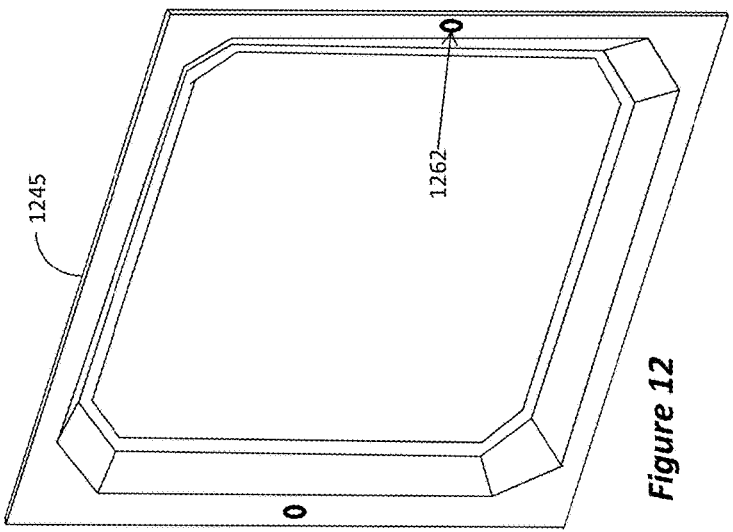
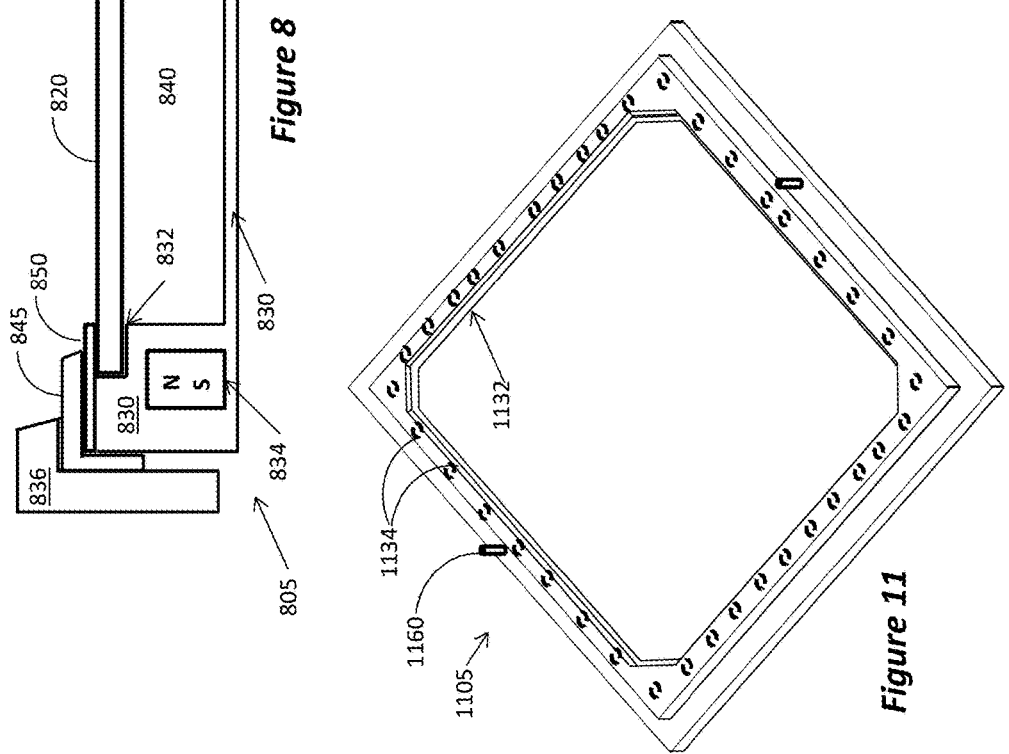

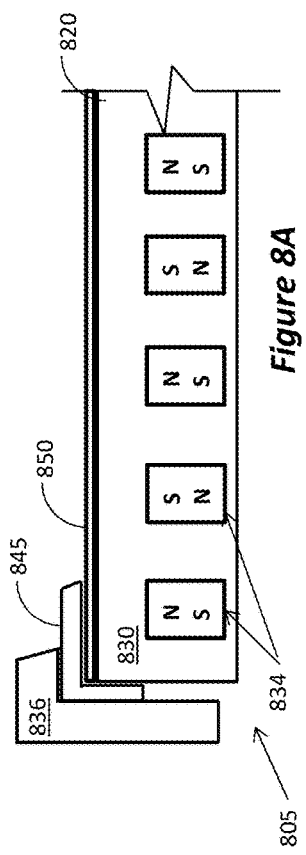
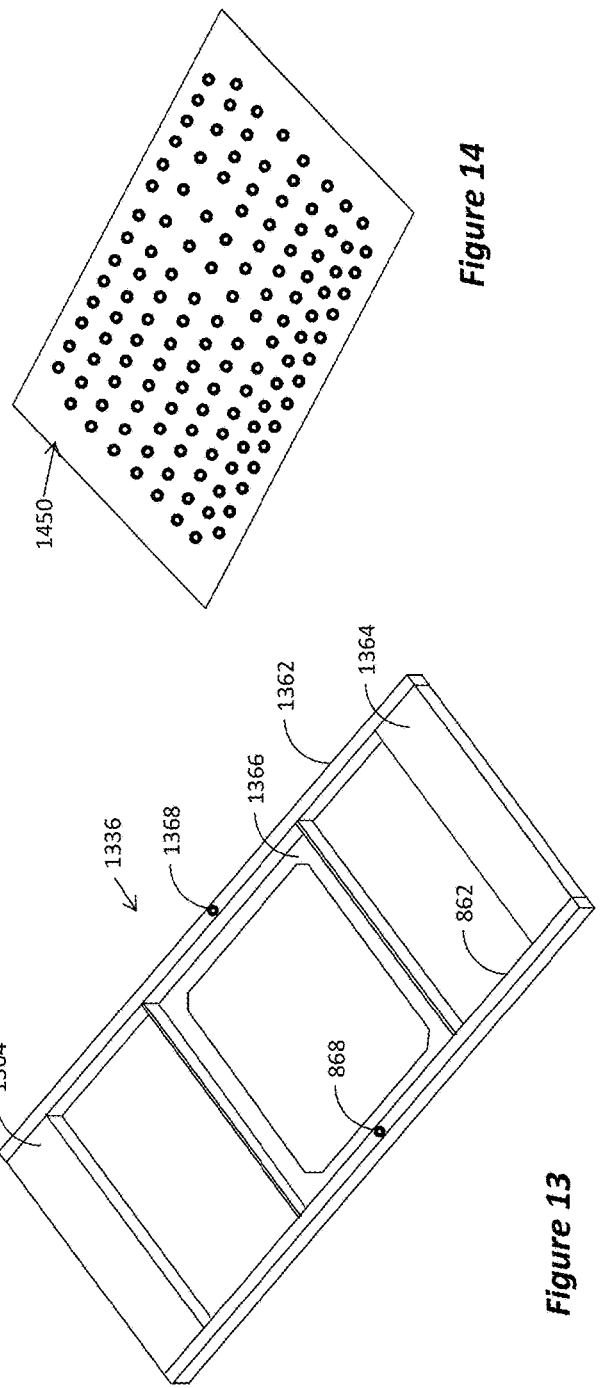

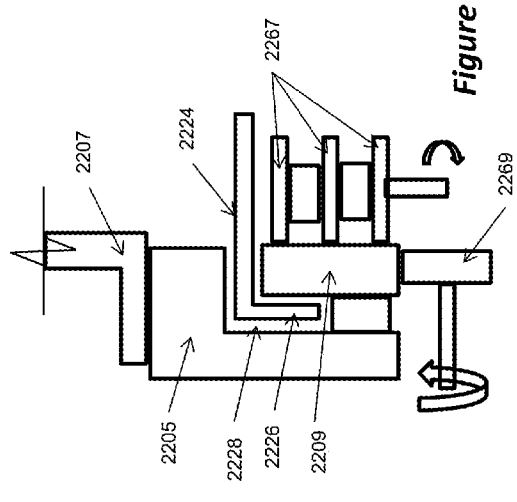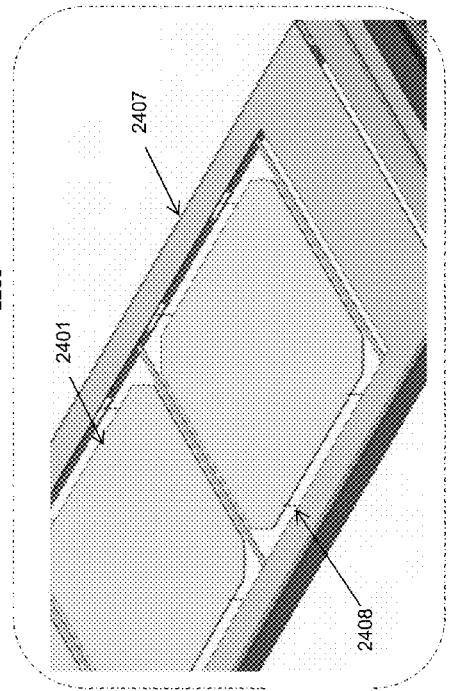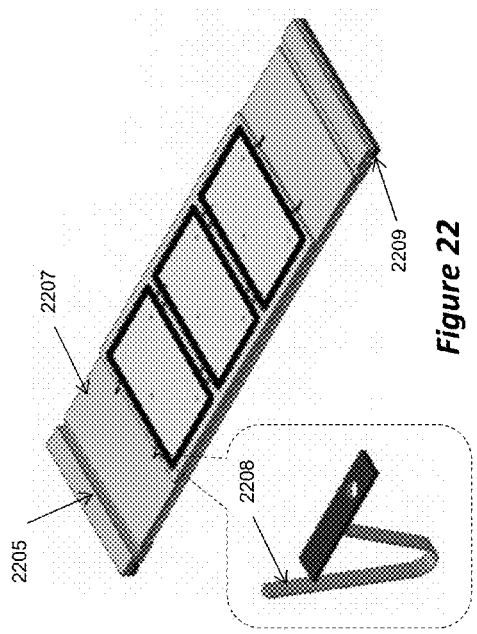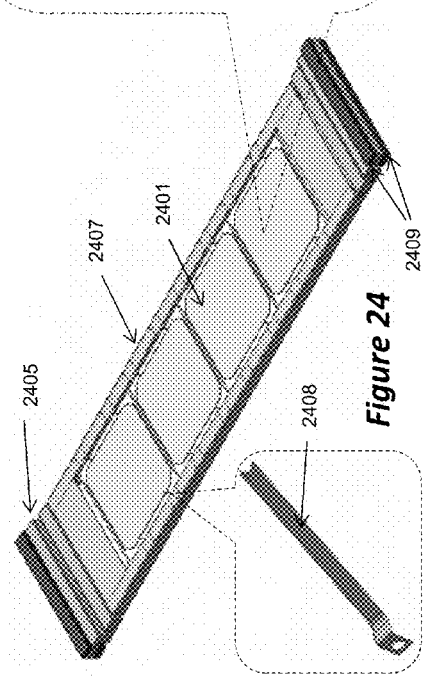

SYSTEM AND METHOD FOR BI-FACIAL PROCESSING OF SUBSTRATES

RELATED APPLICATIONS

This application claims priority benefit from U.S. Provisional Application Ser. No. 61/942,594, filed on Feb. 20, 2014, and U.S. Provisional Application Ser. No. 61/943,999, filed on Feb. 24, 2014, and is a continuation-in-part of U.S. patent application Ser. No. 13/871,871, filed on Apr. 26, 2013, and which claims priority benefit from U.S. Provisional Application Ser. No. 61/639,052, filed on Apr. 26, 2012, the entire disclosures of which are incorporated herein by reference.

BACKGROUND

1. Field

This invention relates to bi-facial processing of substrates, such as substrates used for solar cells, for flat panel displays, etc.

2. Related Art

Various systems are known in the art for fabricating semiconductor IC's, solar cells, touch screens, etc. The processes of these systems are conducted in vacuum and include, e.g., physical vapor deposition (PVD), chemical vapor deposition (CVD), ion implant, etch, etc. There are two basic approaches for such systems: single-substrate processing or batch processing. In single wafer processing, only a single substrate is present inside the chamber during processing. In batch processing several substrates are present inside the chamber during processing. Single substrate processing enables high level of control of the process inside the chamber and the resulting film or structure fabricated on the substrate, but results in a relatively low throughput. Conversely, batch processing results in less control over the processing conditions and the resulting film or structure, but provides a much higher throughput.

Batch processing, such as that employed in systems for fabricating solar cells, touch panels, etc., is generally performed by transporting and fabricating the substrates in a two-dimensional array of n×m substrates. For example, a PECVD system for solar fabrication developed by Roth & Rau utilizes trays of 5×5 wafers for a reported 1200 wafers/hour throughput in 2005. However, other systems utilize trays having two dimensional arrays of 6×6, 7×7, 8×8, and even higher number of wafers, such that a larger number of substrates are processed simultaneously. While throughput is increased utilizing trays of two-dimensional wafer arrays, the handling and the loading and unloading operations of such large trays becomes complex.

In some processes, it is required to apply bias, e.g., RF or DC potential, to the substrate being processed. However, since batch system utilize a moving tray with the substrates, it is difficult to apply the bias.

Also, while some processes can be performed with the substrate held horizontally, some processes can benefit from a vertically held substrate. However, loading and unloading of substrate vertically is complex compared to horizontal loading and unloading.

Some processes may require the use of masks to block parts of the substrate from the particular fabrication process. For example, masks may be used for formation of contacts or for edge exclusion to prevent shunting of the cell. That is, for cells having contacts on the front and back sides, materials used for making the contacts may be deposited on the edges of the wafer and shunt the front and back contacts. Therefore, it is advisable to use mask to exclude the edges of the cell during fabrication of at least the front or back contacts.

As another illustration, for the fabrication of silicon solar cells, it is desirable to deposit blanket metals on the back surface to act as light reflectors and electrical conductors. The metal is typically aluminum, but the blanket metals could be any metal used for multiple reasons, such as cost, conductivity, solderability, etc. The deposited film thickness may be very thin, e.g., about 10 nm up to very thick, e.g., 2-3 um. However, it is necessary to prevent the blanket metal from wrapping around the edge of the silicon wafer, as this will create a resistive connection between the front and back surfaces of the solar cell, i.e., shunting. To prevent this connection, an exclusion zone on the backside edge of the wafer can be created. The typical dimension of the exclusion zone is less than 2 mm wide, but it is preferable to make the exclusion as thin as possible.

One way to create this exclusion zone is through the use of a mask; however, using masks has many challenges. Due to the highly competitive nature of the solar industry, the mask must be very cheap to manufacture. Also, due to the high throughputs of solar fabrication equipment (typically 1500-2500 cells per hour), the mask must be quick and easy to use in high volume manufacturing. Also, since the mask is used to prevent film deposition on certain parts of the wafer, it must be able to absorb and accommodate deposition build up. Furthermore, since film deposition is done at elevated temperatures, the mask must be able to function properly at elevated temperature, e.g., up to 350° C., while still accurately maintaining the exclusion zone width, while accommodating substrate warpage due to thermal stresses.

As another example, in many process flows it is desirable to flip the substrates so as to deposit films on both sides of the substrate. One example is bi-facial or other solar cells, where various layers of different materials are deposited on both the front and back surfaces of the substrate. However, using a large tray of two-directional substrate array makes the flipping operation complicated, or limited to manual operation wherein the tray is removed from the system and workers flip the substrates one by one, potentially leading the contamination and/or breakage. When referring to solar cells, the term "front surface" means the surface that would receive the direct solar radiation during service. When referring to touch screens, the term "from surface" refers to the surface the user's fingers will be touching.

For many thin film applications, the substrate size varies from product to product. This is especially true for touch panel displays. There are many different size pad computers and smartphones, and it would be advantageous to be able to use the same processing system to process all of these substrates. However, changing the substrates during processing is labor intensive manual process which does not lend itself to high volume manufacturing.

Some systems utilize a simple tray, where the substrates sit in pockets. However, with such trays vertical processing is not possible. Also, loading and unloading substrates in such system is difficult to automate. Also, trays do not work well when the processing requires touching only the circumferential edges and not the surfaces of the substrates. It is also very important to prevent the substrate from contacting debris or particles from earlier deposition on larger substrates.

In view of the above, a universal carrier that retains the substrate by only touching the edges and can carry substrates in a vertical orientation is desired.

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Embodiments of the invention provide a system architecture that is modular, in that it enables using different processes and process steps, and versatile, in that it is suitable for fabrication of various devices, including, e.g., solar cells, flat panel displays, touch screens, etc. Moreover, the system can handle different types and sizes of substrates without reconfiguration, but by simply changing the susceptors used.

The system architecture enables substrate handling, such as loading and unloading in atmospheric environment, separate from the vacuum processing. Additionally, various embodiments enable manual loading and unloading with automation in idle or not present, i.e., the system can be implemented without loading/unloading automation. Inside the vacuum environment the system enables static or pass-by processing of the substrates. In certain embodiments, vacuum isolation is provided between each processing chamber, using actuated valves. Various embodiments provide for electrostatic chucking of the substrates to enable efficient cooling and to prevent accidental movement of the substrates. In other embodiments, mechanical chucking is enabled using, e.g., spring-loaded clips with relief mechanism for loading/unloading of the substrates. Various embodiments also enable biasing of the substrates using, e.g., RF or DC bias power, or floating the substrate.

Various embodiments enable simplified handling of substrates by having the handling performed on line-array (i.e., 1×n) carriers, while processing is performed on a two-dimensional array of n×m substrates, by processing several (i.e., m) line-array carriers simultaneously. Other embodiments provide for transport mechanism wherein the substrates are processed in a vertical orientation, but loading and unloading is performed while the substrates are handled horizontally.

Embodiments of the invention also enable substrate processing using masks, which can be implemented by using a dual-mask arrangement. The two part masking system is configured for masking substrates, and includes an inner mask consisting of a flat metal sheet having apertures exposing the parts of the wafer that are to be processed; and, an outer mask configured for placing over and masking the inner mask, the outer mask having an opening cut of size and shape similar to the size and shape of the substrate, the outer mask having thickness larger than thickness of the inner mask. A mask frame may be configured to support the inner and outer masks, such that the outer mask is sandwiched between the mask frame and the inner mask. In one example, where the dual-mask arrangement is used for edge isolation, the opening cut in the inner mask is of size slightly smaller than the solar wafer, so that when the inner mask is placed on the wafer it covers peripheral edge of the wafer, and the opening cut in the outer mask is slightly larger than the opening cut in of the inner mask. A top frame carrier may be used to hold the inner and outer mask and affix the inner and outer masks to the wafer susceptor.

In certain embodiments, the line-array (i.e., 1×n) carriers are configured to be rotatable (flipped upside-down) so as to expose either side of the substrate to processing. The line-array (i.e., 1×n) carriers can be designed symmetrically about a rotation axis, so that one surface of the line-array substrate is processed, then the carriers rotate and the opposite surface of the substrates is processed. The substrates may be held by clips at their periphery, such that the front and back surfaces are not obscured for processing.

A loading and unloading mechanism is provided, which handles several, e.g., four rows of substrates simultaneously. The loading/unloading mechanism is configured for vertical motion, having a lowered position and an elevated position. In its lowered position, the mechanism is configured to simultaneously: remove a row of processed substrates from one carrier, deposit a row of fresh substrates on an empty carrier, deposit a row of processed substrates on a substrate removal mechanism, and collect a row of fresh substrates from a substrates delivery mechanism. The substrate removal mechanism and the substrate delivery mechanism may be conveyor belts moving in the same or opposite directions. In its elevated position, the mechanism is configured to rotate 180 degrees.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1A illustrates an example of a system wherein the carriers remain in a horizontal orientation during transport and processing, while

FIG. 2 illustrates a multi-wafer carrier according to one embodiment, while FIG. 2A illustrates a partial cross-section.

FIG. 2B illustrates an example of carrier for processing silicon wafers, while FIG. 2C illustrates an example of a carrier for processing glass substrates.

FIG. 3A is a top view, while FIG. 3B is a side view of a load/unload mechanism according to one embodiment. FIG. 3C illustrates an embodiment for substrate alignment mechanism.

FIGS. 7A-7E illustrate views of a multi-wafer carrier having an arrangement for dual-mask, according to various embodiments.

FIG. 8 is a cross section of an enlarged part of the frame, outer and inner masks, according to one embodiment, and FIG. 8A is a cross section of an enlarged part of the frame, outer and inner masks, according to anther embodiment.

FIG. 9 illustrates an embodiment of the outer mask, with the inner mask nested therein.

FIG. 10 illustrates an embodiment of the inner mask for use in edge isolation.

FIG. 11 illustrate an embodiment of the single wafer carrier.

FIG. 12 illustrate an embodiment of the outer mask, viewing from the underside.

FIG. 13 illustrates an embodiment of a top frame to support the inner and outer masks.

FIG. 14 illustrates an embodiment of the inner mask for creating plurality of holes in the wafer.

FIG. 22 illustrates an embodiment of substrate carrier arrangement that can be processed in a horizontal or vertical orientation, while FIG. 23 illustrates the arrangement of FIG. 22 in a vertical placement.

FIG. 24 illustrates an embodiment of substrate carrier arrangement that can be flipped so as to process both surfaces of the substrates.

DETAILED DESCRIPTION

The following detailed description provides examples that highlight certain features and aspects of the innovative processing system claimed herein. Various disclosed embodiments provide for a system wherein multiple substrates, e.g., semiconductor or glass substrates, are processed simultaneously inside a vacuum processing chamber, such as, e.g., a plasma processing chamber. While glass substrates, such as those used for touchscreens are not generally considered wafers, it should be appreciated that references made to wafers in this disclosure are made for convenience and ease of understanding, but that glass substrates may be substituted for all such references.

Figure 1:
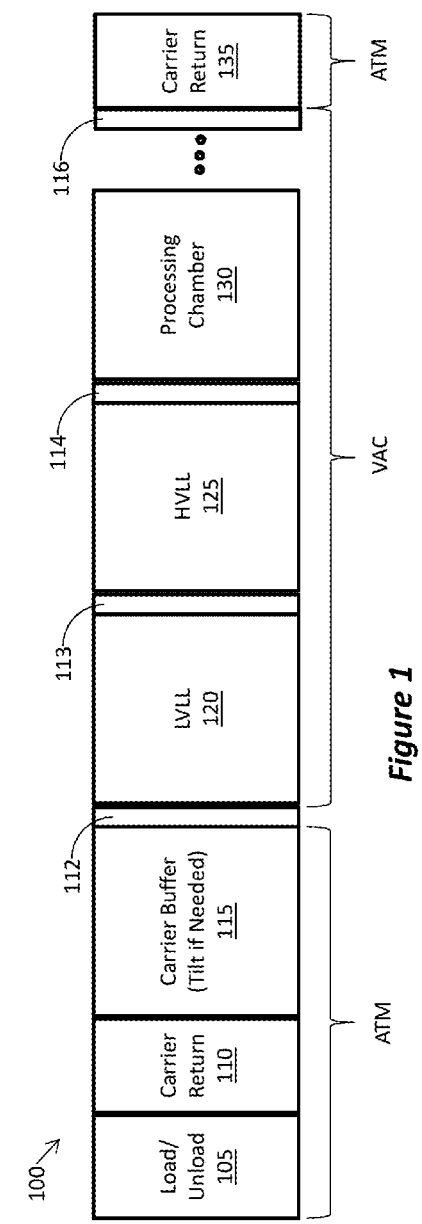
FIG. 1 illustrates an embodiment of a multi-substrate processing system, wherein transport carriers support a line-array of substrates, but processing is performed on a two-dimensional array of substrates.

FIG. 1 is a top-view illustration of an embodiment of a multi-substrate processing system, wherein transport carriers support a line-array of substrates, but processing is performed on a two-dimensional array of substrates. In the system 100 illustrated in FIG. 1, the substrates are loaded and unloaded at load/unload station 105, i.e., from the same side of the system. However, it should be appreciated that the system may also be designed such that a loading station is provided on one side of the system, while an unloading station is provided on the opposite side of the system. In some embodiments, loading and/or unloading of substrates onto/from the carriers may be performed manually, while in others automation is provided to perform one or both of these tasks.

The substrates are loaded onto carriers positioned in load/unload station 105, and which were transported from carrier return station 110. Each carrier supports a linear array of substrates, i.e., two or more substrates arranged in a single row, in a direction perpendicular to the direction of travel inside the system. From load/unload station 105 the carriers are moved via the carrier return station 110 to buffer station 115. The carriers are parked in buffer station 115 until the low vacuum loadlock (LVLL) 120 is ready to accept them. In some embodiments, which will be described later, the buffer station also serves as the tilting station, wherein horizontally oriented carriers are tilted 90° to assume a vertical orientation. In such embodiments, clips are used to hold the substrate in place when assuming a vertical orientation.

At the proper time, valve 112 opens and the carriers positioned in buffer station 115 are transported into LVLL 120. Valve 112 is then closed and the LVLL 120 is evacuated to a rough vacuum level. Thereafter valve 113 opens and the carriers from LVLL 120 are transported into high vacuum loadlock (HVLL) 125. Once HVLL has been pumped to its vacuum level, valve 114 opens and the carriers from HVLL 125 are transported into processing chamber 130. The system may have any number of processing chambers 130 aligned linearly such that the carriers may be transported from one chamber to the next via a valve positioned between each two processing chambers. At the end of the last processing chamber, a valve is positioned that leads to the reverse loadlock arrangement as in the entrance to the system, i.e., first a HVLL and then a LVLL. Thereafter the carriers exit to the carrier return module 135 via valve 116. From return module 135 the carriers are returned to carrier return station 110 using, e.g., conveyor positioned above or below the processing chambers 130 (not shown).

In general, the designer of vacuum processing systems faces two competing solutions: for easy loading/unloading and automation, it is better to have the substrate carriers designed to carry a small number of substrates, with the ultimate having each carrier supporting a single substrate. Conversely, for throughput and efficiency in vacuum pumping, it is preferable that the carriers carry the maximum possible number of substrates—which leads to difficulties in loading/unloading and automation. A feature disclosed herein is a system wherein each carrier supports a given number of substrates, e.g., and array of N×M substrates, but each step within the vacuum system is carried out on multiple carriers simultaneously. For example, if k carriers are operated upon simultaneously, then in each processing step the system operates on k×N×M substrates.

To provide a numerical example, it is much simpler to design loading/unloading automation for a carrier that supports six substrates than one that supports eighteen substrates. So, in one example, a carrier is designed to support an array of 2×3 substrates. However, each step in the system, including the loadlock, is designed to be carried out on three carriers simultaneously. Thus, for example, the loadlock is vacuum pumped after three carriers have entered the loadlock. Thus, after pumping the loadlock, 18 substrates are in vacuum inside the loadlock. Further, a simpler design can be pursued wherein each carrier supports a linear array, i.e., 1×M of substrates. For the same effect, one may use three carriers having 1×6 substrates each, of six carriers having 1×3 substrates each. In summary, each carriers is configured to carry a given number of substrates, and each vacuum chamber is configured to accommodate and operate simultaneously on a plurality of carriers.

For simplicity, the following examples are described with respect to a system wherein each carrier supports a linear array of substrates, which makes it easier to load and unload the substrates, and makes the carriers much easier to manufacture, handle, and transport. However, in order to have high throughput of the system, each processing chamber 130 is configured to house and simultaneously process a two-dimensional array of substrates positioned on several, i.e., two or more, carriers positioned one after the other. For better efficiency, in the particular embodiment of FIG. 1, buffer station 115, LVLL 120 and HVLL 125 are each configured to simultaneously house the same number of carrier as are simultaneously housed inside the processing chamber 130. For example, each carrier may support three glass substrates in one row, but each processing chamber is configured to process two carriers simultaneously, thus processing a two-dimensional array of 3×2 substrates.

According to other embodiments, the load locks and buffer chambers are sized to handle multiple carriers, e.g., two carriers, to provide for increased pump/vent, and pressure stabilization times. Also, a buffer chamber can be used to transition carrier motion from one of station to station motion to one of continues pass-by motion inside a processing chamber. For example, if one process chamber process carriers in stationary mode while the next chamber processes in pass-by mode, a buffer chamber may be placed between these two chambers. The carriers in the system create a continuous stream of carriers in the process chamber or module, and each process chamber/module may have 5-10 carriers continuously moving in a head to toe fashion past the process source (e.g., heat source, PVD, etch, etc).

As shown in FIG. 1, the parts of the system dedicated for transport, loading and unloading of substrates are positioned in atmospheric environment. On the other hand, all processing is performed in vacuum environment. Transport, loading and unloading in atmospheric environment is much easier than in vacuum.

Figure 1B:
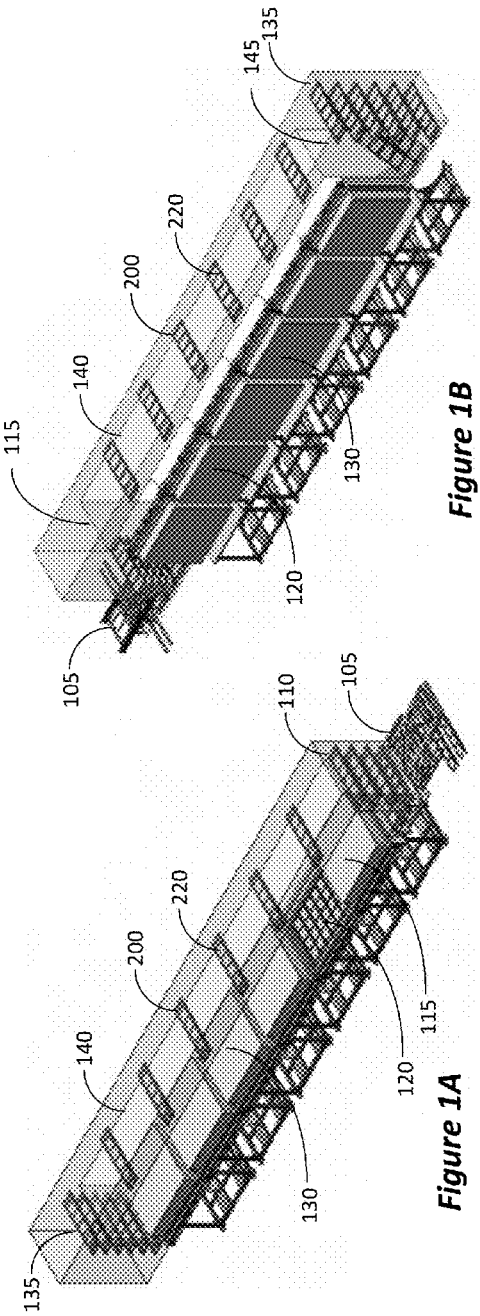
FIG. 1B illustrates an example wherein the carriers are horizontal during transport and loading/unloading, but are vertical during processing.
Figure 1A:
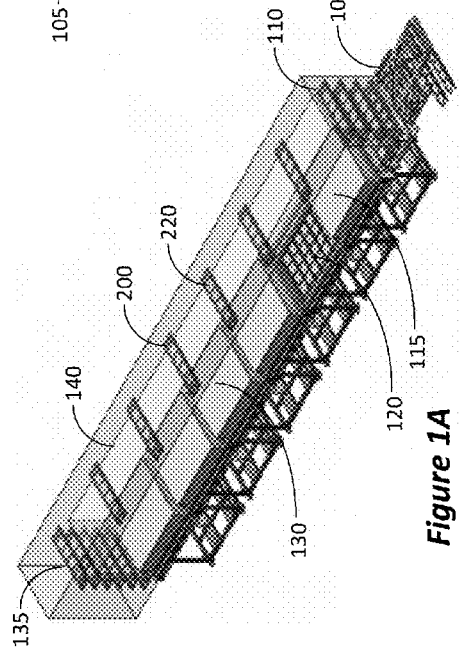

FIG. 1A illustrates an example of a system, such as that shown in FIG. 1, wherein the carriers 200 remain in a horizontal orientation during transport and processing. The carriers are returned to the starting point via conveyor 140 positioned above the processing chambers. As shown in FIG. 1A, each carrier 200 supports four substrates 220 arranged linearly in one row. Also, for explanation purposes, the top part of chamber 120 is removed, so as to expose the arrangement of six carriers positioned simultaneously therein. Therefore, according to this embodiment, while each carrier supports four substrates, each chamber process twenty-four substrates simultaneously.

FIG. 1B illustrates an example wherein the carriers are horizontal during transport and loading/unloading, but are vertical during processing. The arrangement of FIG. 1B is very similar to that of FIG. 1A, except that the loadlock and processing chambers are flipped vertically, so as to process the substrates in a vertical orientation. The construction of loadlock and processing chambers in both embodiments of FIGS. 1A and 1B may be identical, except that in FIG. 1A they are mounted horizontally, while in FIG. 1B they are mounted on their side vertically. Consequently, the buffer stations 115 and the buffer station 145 on the other end of the system, are modified to include a lifting arrangement which changes the orientation of the carriers 90°, as shown in buffer station 145.

FIG. 2 illustrates a line-array carrier according to one embodiment, which may be configured for processing silicon wafers, glass substrates, etc. As shown in FIG. 2, the construction of the line-array carrier according to this embodiment is rather simple and inexpensive. It should be appreciated that the carrier can be configured for a different number of substrates and substrate size, by simply mounting different chucks on top of the carrier. Also, it should be appreciated that each processing chamber may be configured to accommodate several carriers simultaneously, thus processing multiple wafers on multiple carriers simultaneously.

The carrier 200 of FIG. 2 is constructed of a simple frame 205 which is formed by two transport rails 225 and two ceramic bars 210. The ceramic bar 210 improves thermal isolation of the susceptor (not shown) attached thereto from the remaining parts of the chamber. At least one side of each ceramic bar 210 forms a fork arrangement 235 with the transport rail 225, as shown in the callout. A cavity 245 is formed in the fork arrangement 235, such that the ceramic bar 210 is allowed to freely move (illustrated by the double-head arrow) due to thermal expansion, and not impart pressure on the transport rail 225.

A magnetic drive bar 240 is provided on each of the transport rails 225 to enable transporting the carrier throughout the system. The magnetic drive bars ride on magnetized wheels to transport the carrier. To enhance cleanliness of the system, the drive bars 240 may be nickel plated. This magnetic arrangement enables accurate transport without sliding of the carrier due to high accelerations. Also, this magnetic arrangement enables large spacing of the wheels, such that the carrier is attached to the wheels by magnetic forces and may cantilever to a large extent to traverse large gaps. Additionally, this magnetic arrangement enables transport of the carrier in either vertical or horizontal orientation, since the carrier is attached to the wheels by magnetic forces.

Carrier contact assembly 250 is attached to the transport rail 225 and mates with a chamber contact assembly 252 (see callout) attached to the chamber. The chamber contact assembly has an insulating bar 260 having a contact brush 262 embedded therein. The contact assembly 250 has a conductive extension 251 (FIG. 2A) that is inserted between an insulating spring 264 and insulting bar 260, thus being pressed against brush contact 264 so as to receive bias potential from the mating contact. The bias may be used for, e.g., substrate bias, substrate chucking (for electrostatic chuck), etc. The bias may be RF or DC (continuous or pulsed). The carrier contact assembly 250 may be provided on one or both sides of the carrier.

FIG. 2A is a partial cross-section showing how the carrier is transported and how it receives bias power. Specifically, FIG. 2A illustrates the drive bar 240 riding on three magnetized wheels 267, which are attached to shaft 268. Shaft 268 extends beyond the chamber wall 269, such that it is rotated from outside the interior vacuum environment of the chamber. The shaft 268 is coupled to a motor via flexible belt such as, e.g., an O-ring, to accommodate variations in shaft diameter.

FIG. 2B illustrates an example of carrier for processing silicon wafers, e.g., for fabricating solar cells. In FIG. 2B wafers 220 may be chucked to susceptor 223 using, e.g., chucking potential. A lifter 215 may be used to lift and lower the wafers for loading and unloading. FIG. 2C illustrates an embodiment wherein the carrier may be used for processing glass substrates such as, e.g., touchscreens. In this embodiment the substrates may be held in place using mechanical spring-loaded clamps or clips 227. The susceptor 224 may be a simple pallet with arrangement for the spring-loaded clips.

FIGS. 3A and 3B illustrate an embodiment for substrate loading and unloading mechanism, in conjunction with the carrier return. FIG. 3A is a top view of the load/unload mechanism, while FIG. 3B is a side view. As shown in FIG. 1A, a conveyor returns the carriers after completion of processing. The carriers are then lowered by elevator 107 and transported horizontally to the loading/unloading station 105. As shown in FIGS. 3A and 3B, a dual conveyor, i.e., conveyors 301 and 303, are used to bring fresh substrates for processing and remove processed wafers. It is rather immaterial which one brings the fresh wafers and which one removes the processed wafers, as the system would work exactly the same regardless. Also, in this embodiment it is shown that conveyors 301 and 303 transport substrates in the opposite direction, but the same result can be achieved when both conveyors travel in the same direction.

The arrangement of FIGS. 3A and 3B supports handling two carriers simultaneously. Specifically, in this embodiment processed substrates are unloaded from one carrier, while fresh substrates are loaded onto another carrier, simultaneously. Moreover, at the same time, processed substrates are deposited on the processed substrate conveyor and fresh substrates are picked-up from the fresh substrates conveyor, to be delivered to a carrier in the next round. This operation is performed as follows.

The substrate pick-up mechanism is configured to have two motions: rotational and vertical motions. Four rows of chucks 307 are attached to the substrate pick-up mechanism 305. The chucks 307 may be, for example, vacuum chucks, electrostatic chucks, etc. In this specific example, four rows of Bernoulli chucks are used, i.e., chucks that can hold a substrate using Bernoulli suction. The four rows of chucks are positioned two rows on each side, such that when two rows of chucks are aligned with the carriers, the other two rows are aligned with the conveyors. Thus, when the pick-up mechanism 305 is in its lowered position, one row of chucks picks up processed substrates from a carrier and another row deposits fresh substrates on another carrier, while on the other side one row of chucks deposit processed substrates on one conveyor and another row of chucks pick-up fresh substrate from the other conveyor. The pick-up mechanism 305 then assumes its elevated position and rotates 180 degrees, wherein at the same time the carriers move one pitch, i.e., the carrier with the fresh substrates move one step, the carrier from which processed substrates were removed moves into a fresh substrate loading position, and another carrier with processed substrates moves into the unloading position. The pick-up mechanism 305 then assumes its lowered position and the process is repeated.

To provide a concrete example, in the snapshot of FIG. 3A, carrier 311 has processed substrates which are being picked-up by one row of chucks on pick-up arrangement 305. Carrier 313 is being loaded with fresh substrates from another row of chucks of pick-up arrangement 305. On the other side of pick-up arrangement 305 one row of chucks is depositing processed substrates on conveyor 303, while another row of chucks is picking up fresh substrates from conveyor 301. When these actions have been completed, pick-up arrangement 305 is raised to its elevated position and is rotated 180 degrees, as shown by the curved arrow. At the same time, all of the carriers move one step, i.e., carrier 316 moves to the position previously occupied by carrier 317, carrier 313, now loaded with fresh substrates, moves to the spot previously occupied by carrier 316, carrier 311, now empty, moves to the spot previously occupied by carrier 313, and carrier 318, loaded with processed substrates moves into the spot previously occupied with carrier 311. Now the pick-up arrangement is lowered, such that carrier 311 is loaded with fresh substrates, processed substrates are removed from carrier 318, the substrates removed from carrier 311 are deposited onto conveyor 303, and fresh substrates are picked-up from conveyor 301. The pick-up arrangement 305 is then elevated, and the process repeats.

The embodiment of FIGS. 3A and 3B also utilizes an optional mask lifter arrangement 321. In this embodiment, masks are used to generate a required pattern on the surface of the substrate, i.e., expose certain areas of the substrate for processing, while covering other areas to prevent processing. The carrier travels through the system with the mask placed on top of the substrate until it reaches the mask lifer 321. When a carrier with processed substrates reaches the mask lifter (in FIGS. 3A and 3B, carrier 318), the mask lifter 321 assumes its elevated position and lifts the mask from the carrier. The carrier can then proceed to the unload station to unload its processed substrates. At the same time, a carrier with fresh substrates (in FIG. 3B carrier 319), movers into the mask lifter arrangement and mask lifter 321 assumes its lowered position so as to place the mask onto the fresh substrates for processing.

As can be appreciated, in the embodiment of FIGS. 3A and 3B, the mask lifter removes the masks from one carrier and places them on a different carrier. That is, the mask is not returned to the carrier from which it was removed, but is rather placed on a different carrier. Depending on the design and number of carriers in the system, it is possible that after several rounds a mask would be returned to the same carrier, but only after being lifted from another carrier. The converse is also true, i.e., depending on the design and the number of carriers and masks in service, it is possible that each mask would be used by all carriers in the system. That is, each carrier in the system would be used with each of the masks in the system, wherein at each cycle of processing through the system the carrier would use a different mask.

As shown in the callout, the carrier elevator may be implemented by having two vertical conveyor arrangements, one on each side of the carriers. Each conveyor arrangement is made of one or more conveyor belt 333, which is motivated by rollers 336. Lift pins 331 are attached to the belt 333, such that as the belt 333 moves, the pins 331 engage the carrier and move the carrier in the vertical direction (i.e., up or down, depending on which side of the system the elevator is positioned at and whether the carrier return conveyor is positioned over or below the processing chambers).

FIG. 3C illustrates an embodiment for substrate alignment mechanism. According to this embodiment, chuck 345 has spring loaded alignment pins 329 on one side and a notch 312 on the opposite side. A rotating push-pin 341 is configured to enter the notch 312 to push the substrate 320 against the alignment pin 329 and then retract, as illustrated by the dotted-line and rotational arrow. Notably, the rotating push-pin 341 is not part of the chuck 345 or the carrier and does not travel within the system, but is stationary. Also, the spring-loaded alignment pin is compressed to a lower position if a mask is used. Thus, a substrate alignment mechanism is provided which comprises a chuck having a first side configured with an alignment pin, a second side orthogonal to the first side and configured with two alignment pins, a third side opposite the first side and configured with a first notch, and a fourth side opposite the second side and configured with a second notch; the alignment mechanism further comprising a first push-pin configured to enter the first notch to push the substrate against the first alignment pin, and a second push-pin configured to enter the second notch and push the substrate against the two alignment pins.

Figure 4:
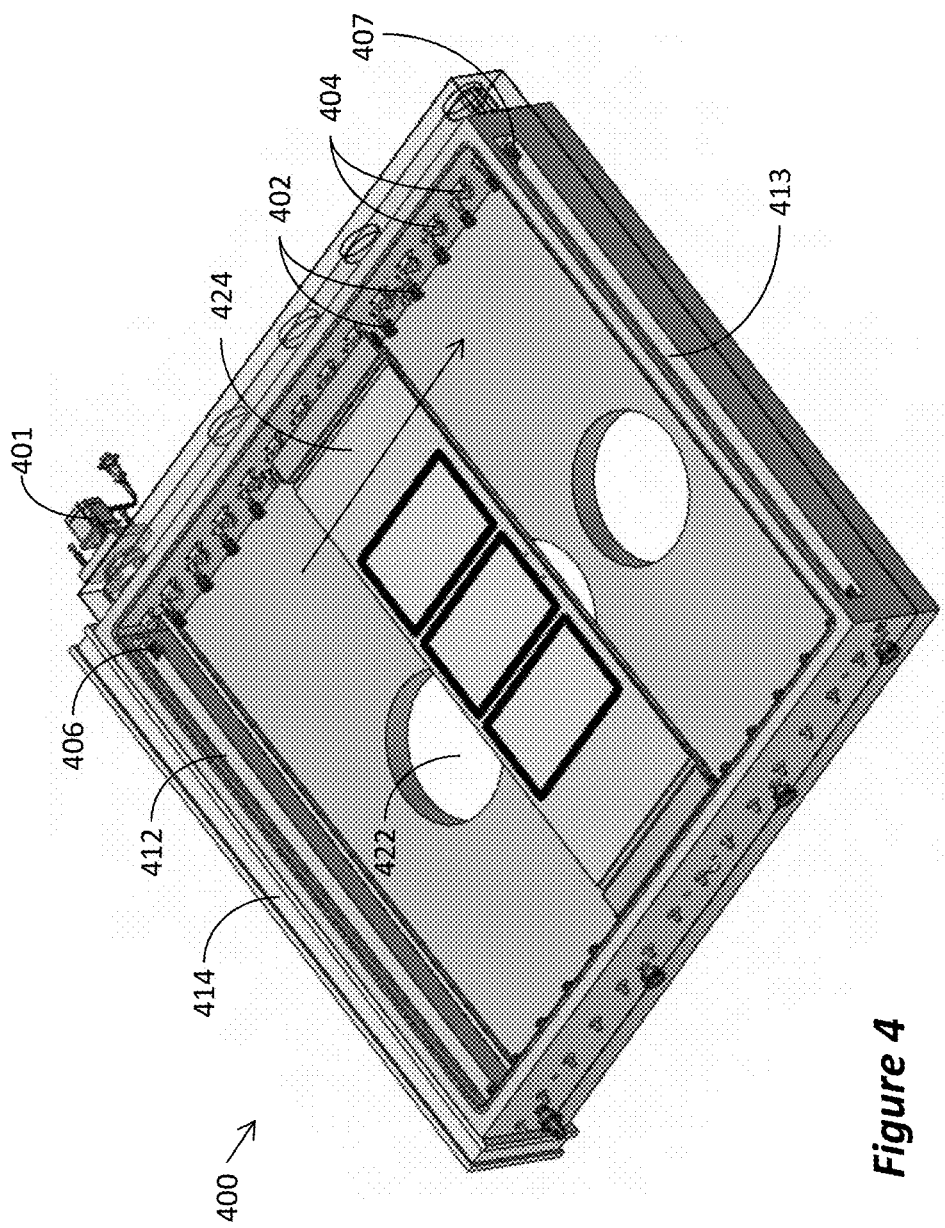
FIG. 4 illustrates an embodiment of a vacuum processing chamber 400 that may be used with the disclosed system.

FIG. 4 illustrates an embodiment of a vacuum processing chamber 400 that may be used with the disclosed system. In the illustration of FIG. 4, the lid of the chamber is removed to expose its internal construction. The chamber 400 may be installed in a horizontal or vertical orientation, without any modifications to its constituents or its construction. The chamber is constructed of a simple box frame with openings 422 for vacuum pumping. An entry opening 412 is cut in one sidewall, while an exit opening 413 is cut in the opposite sidewall, to enable the carrier 424 to enter the chamber, traverse the entire chamber, and exit the chamber from the other side. Gate valves are provided at each opening 412 and 413, although for clarity in the illustration of FIG. 4 only gate valve 414 is shown.

To enable efficient and accurate transport of the carrier 424 in a horizontal and vertical orientation, magnetic wheels 402 are provided on the opposing sidewall of the chamber. The carrier has magnetic bars that ride on the magnetic wheels 402. The shafts upon which the wheels 402 are mounted extend outside the chamber into an atmospheric environment, wherein they are motivated by motor 401. Specifically, several motors 401 are provided, each motivating several shafts using belts, e.g., O-rings. Also, idler wheels 404 are provided to confine the carriers laterally.

A feature of the embodiment of FIG. 4 is that the diameter of the magnetic wheels is smaller than the chamber's sidewall thickness. This enables placing magnetic wheels inside the inlet and outlet openings 412 and 413, as shown by wheels 406 and 407. Placing wheels 406 and 407 inside the inlet and outlet opening 412 and 413 enables smoother transfer of the carriers into and out of the chamber, as it minimizes the gap that the carriers have to traverse without support from wheels.

Figure 5:
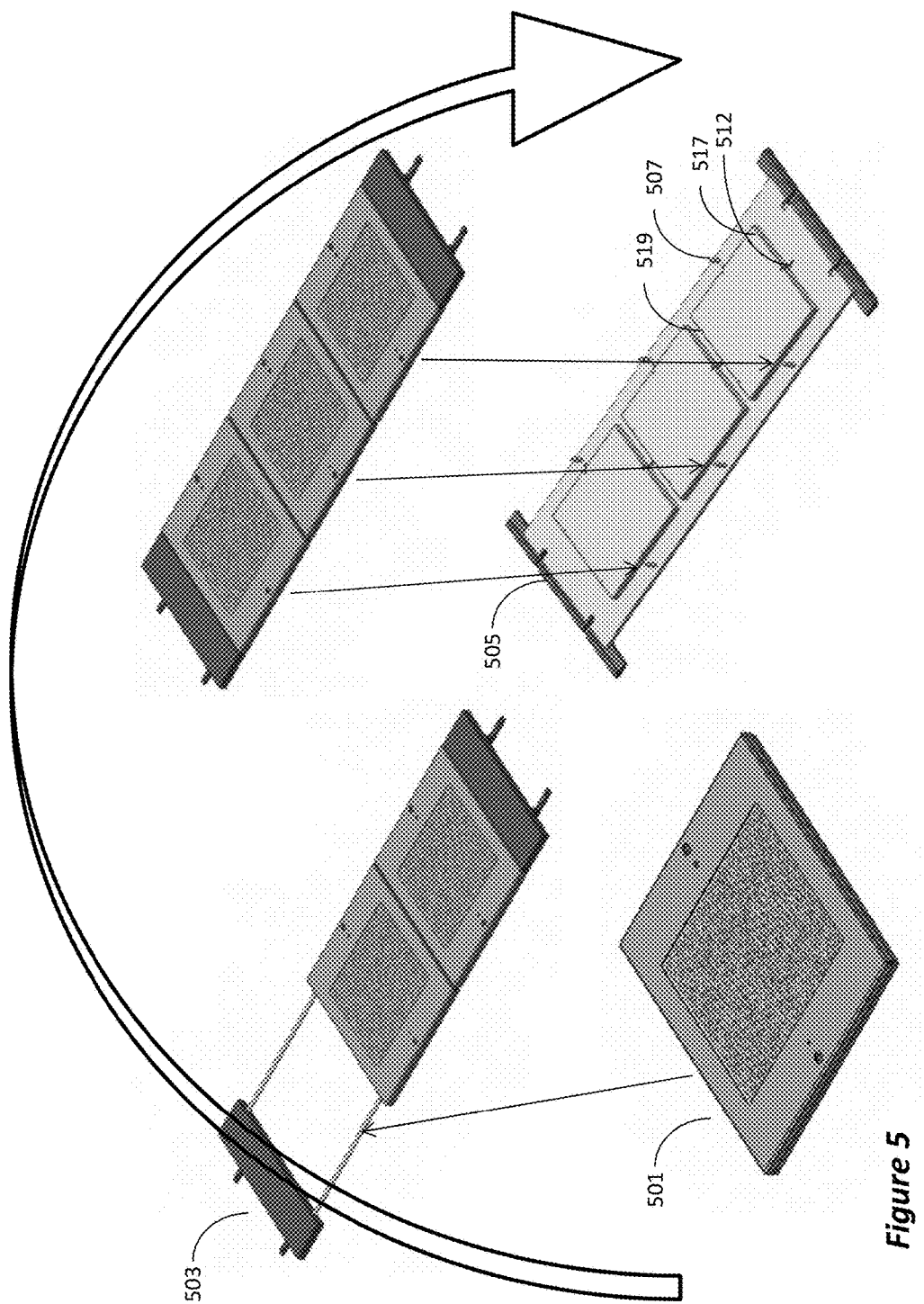
FIG. 5 illustrates an embodiment for a mask and carrier assembly.

FIG. 5 illustrates an embodiment for a mask and carrier assembly. Progressing from left to right along the curved arrow, a single-substrate mask assembly 501 is mounted onto a mask carrier 503, supporting several mask assemblies; and the mask carrier 503 is mounted onto a substrate carrier 505. In one embodiment, springs between the floating mask assemblies 501 keep them in place for engagement with guide pins 507, provided on the substrate carriers 505, such that each mask is aligned to its respective substrate. Each single-substrate mask assembly is constructed of an inner foil mask that is cheap and capable of many repeated uses. The foil mask is made of s flat sheet of magnetic material with perforations according to a desired design. An outer mask covers and protects the inner mask by taking the heat load, so that the foil mask does not distort. An aperture in the outer mask exposes the area of the inner mask having the perforations. A frame holds the inner and outer masks onto the mask carrier 503. Magnets embedded in the substrate carrier 505 pull the inner foil mask into contact with substrate.

Each substrate support, e.g., mechanical or electrostatic chuck, 517 supports a single substrate. The individual chucks 517 can be changed to support different types and/or sizes of substrates, such that the same system can be used to process different sizes and types of substrates, using the same carrier but with interchangeable susceptors. In this embodiment the chuck 517 has substrate alignment pins 519 which are retractable, and provisions to align the substrate on top of the chuck. In this embodiment, the provisions to enable alignment consist of a slit 512 accommodating a retractable pusher pin that pushes the substrate against alignment pins 519 and then retracts out of the slit 512. This allows for aligning the substrate and the mask to the substrate carrier, such that the mask is aligned to the substrate. The retractable pusher pin assembly is attached to the loading station and not to the carrier. This dramatically reduces the number of pusher pins required, i.e., the system only needs as many pusher pins as the number of substrates supported on one carrier. Additionally, it also simplifies the construction of the carrier, since no alignment mechanism needs to be incorporated into the carrier.

As can be understood, the system described thus far is inexpensive to manufacture and provide efficient vacuum processing of various substrates, such as, e.g., solar cells, touchscreens, etc. The system can be configured with double or single end loading and unloading, i.e., substrate loading and unloading from one side, or loading from one side and unloading from the opposite side. No substrate handling is performed in vacuum. The system is modular, in that as many vacuum processing chambers as needed may be installed between the input and output loadlocks. The vacuum chambers have a simple design with few parts in vacuum. The vacuum chambers may be installed in a horizontal or vertical orientation. For example, for solar cell processing the system may process the substrates in a horizontal orientation, while for touchscreens the substrates may be processed in a vertical orientation. Regardless, loading, unloading and transport in atmospheric environment is done with the substrates in a horizontal orientation. The processing sources, e.g., sputtering sources, may be installed above and/or below the substrates. The system is capable of pass-by or static processes, i.e., with the substrate stationary or moving during vacuum processing. The chambers may accommodate sputtering sources, heaters, implant beam sources, ion etch sources, etc.

For solar applications the vacuum chamber may include a low energy implanter (e.g., less than 30 kV). For specific solar cell design, such as PERC, IBC or SE, the mask arrangement may be used to perform masked implant. Also, texture etch may be performed with or without mask, using an ion etch source or laser assisted etch. For point contact cells, masks with many holes aligned to the contacts can be used. Also, thick metal layers can be formed by serially aligning several PVD chambers and forming layers one over the other serially.

For touch panel applications, the chambers may be used to deposit cold and/or hot ITO layers using PVD sources. The processing is performed with several, e.g., three touch panels arranged widthwise on each carrier, and several, e.g., two, carriers positioned inside each chamber simultaneously for higher throughput but simpler handling. The same system can handle touchscreens for pads or cellphone size glass without any internal reconfigurations. Simply, the appropriate carrier is configured and the entire system remains the same. Again, no substrate handling is performed in vacuum.

The handling and processing operations can be the same for all types and sizes of substrates. An empty carrier moves to load from carrier return elevator. If a mask is used, the mask is removed and stays at the elevator. Substrates are loaded onto the carrier in atmospheric environment. Meanwhile a loaded carrier moves into the elevator and the masks are placed on top of the fresh substrates. The carrier then moves into the load lock. Once a predefined number pf freshly loaded carriers are inside the loadlock, the gate valve is closed and vacuum is pumped inside the loadlock. In vacuum the carrier transport is via simple magnetic wheels positioned in chamber wall and energized from outside the chamber in atmospheric or vacuum environment. The chambers can have valves for isolation, and can have sources above or in a drawer for process below the substrates. The substrates can be removed at an unload end of the system, or left on carriers to return to the loading end, i.e., entry side of the system. Carriers return on simple conveyor belt from process end of the system to load end of the system. Simple pin conveyor lifts or lowers the carriers to or from load and unload stations.

Figure 6A:
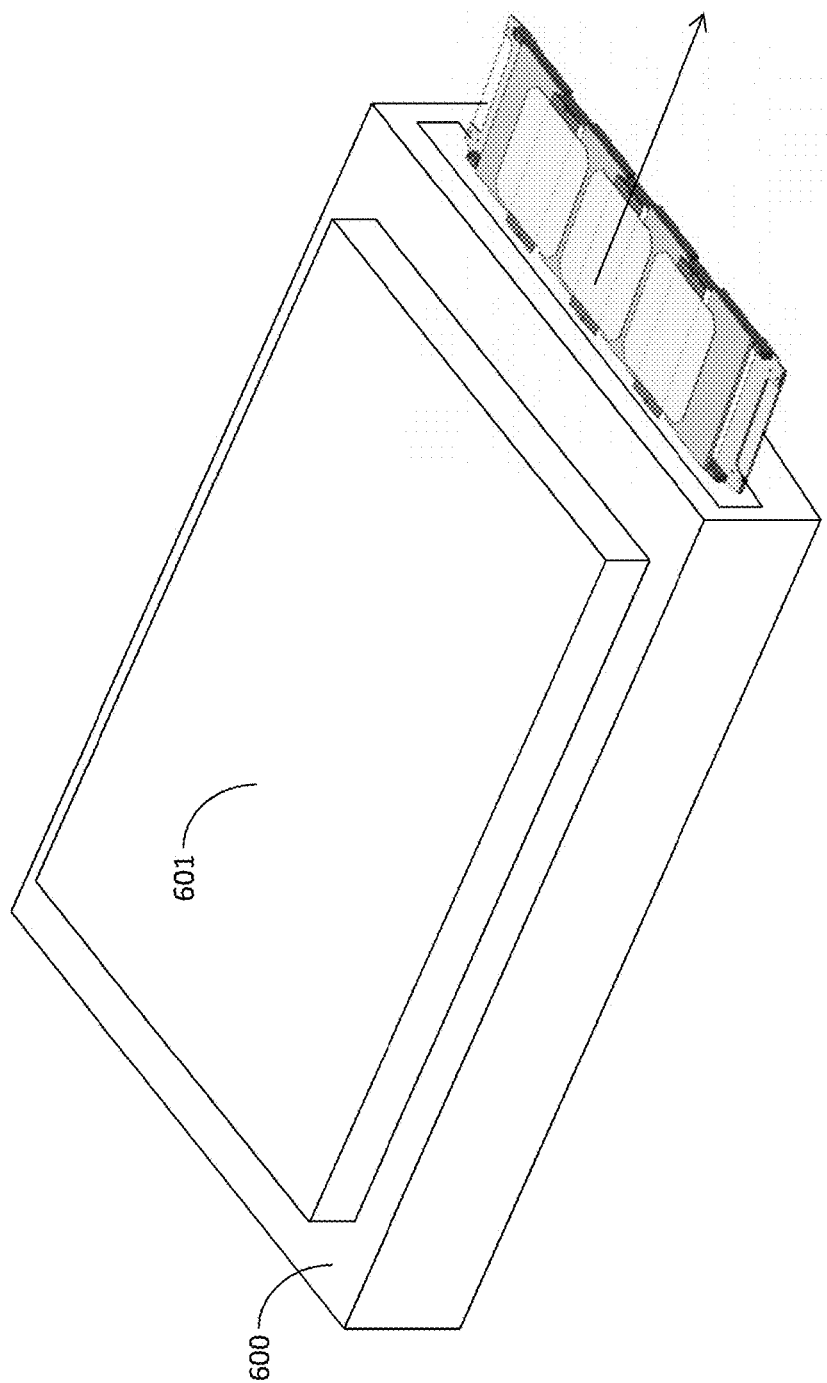
FIGS. 6A-6C illustrate three embodiments demonstrating how the vacuum chamber can be fitted with different processing sources of varying sizes and configurations.
Figure 6B:
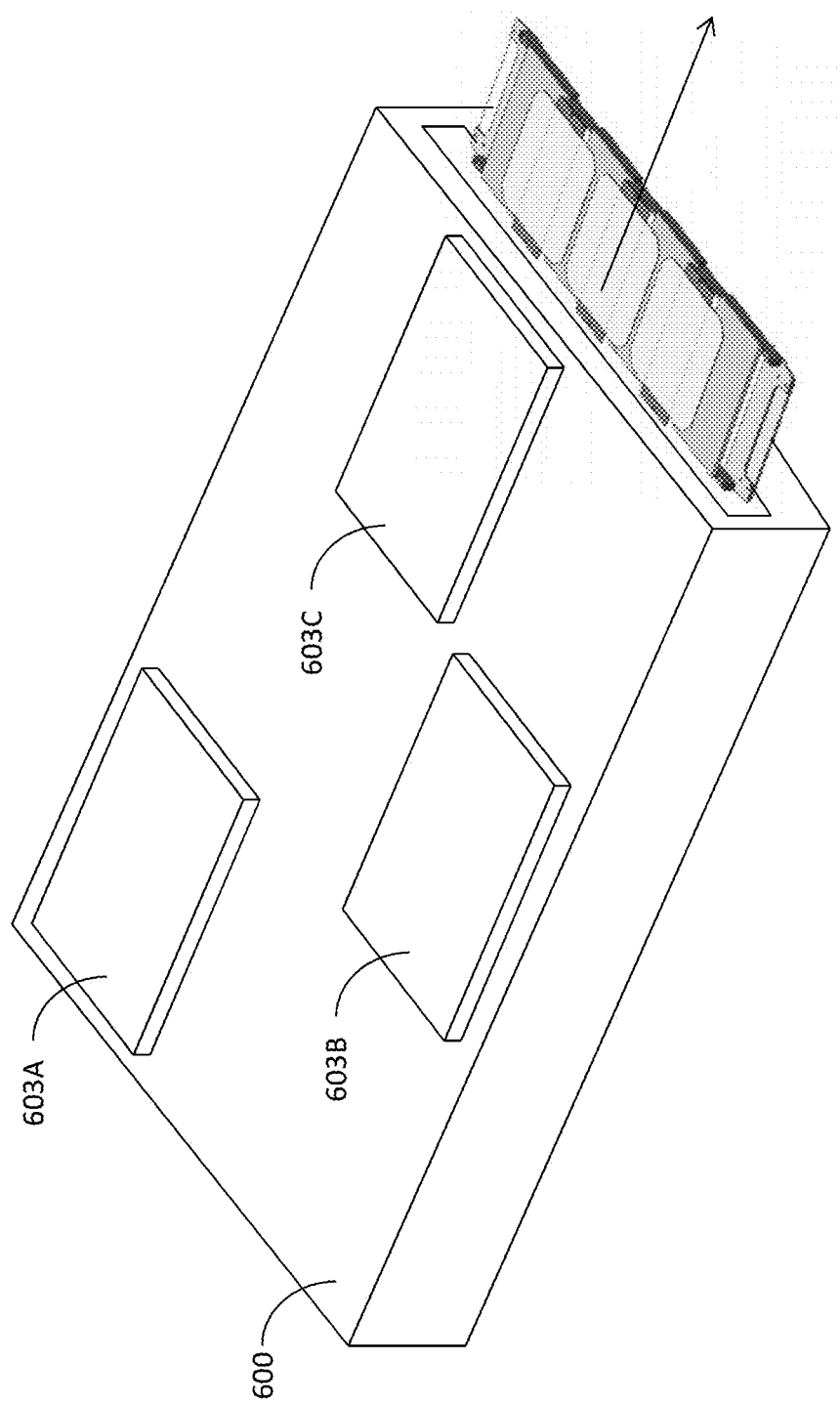
Figure 6C:
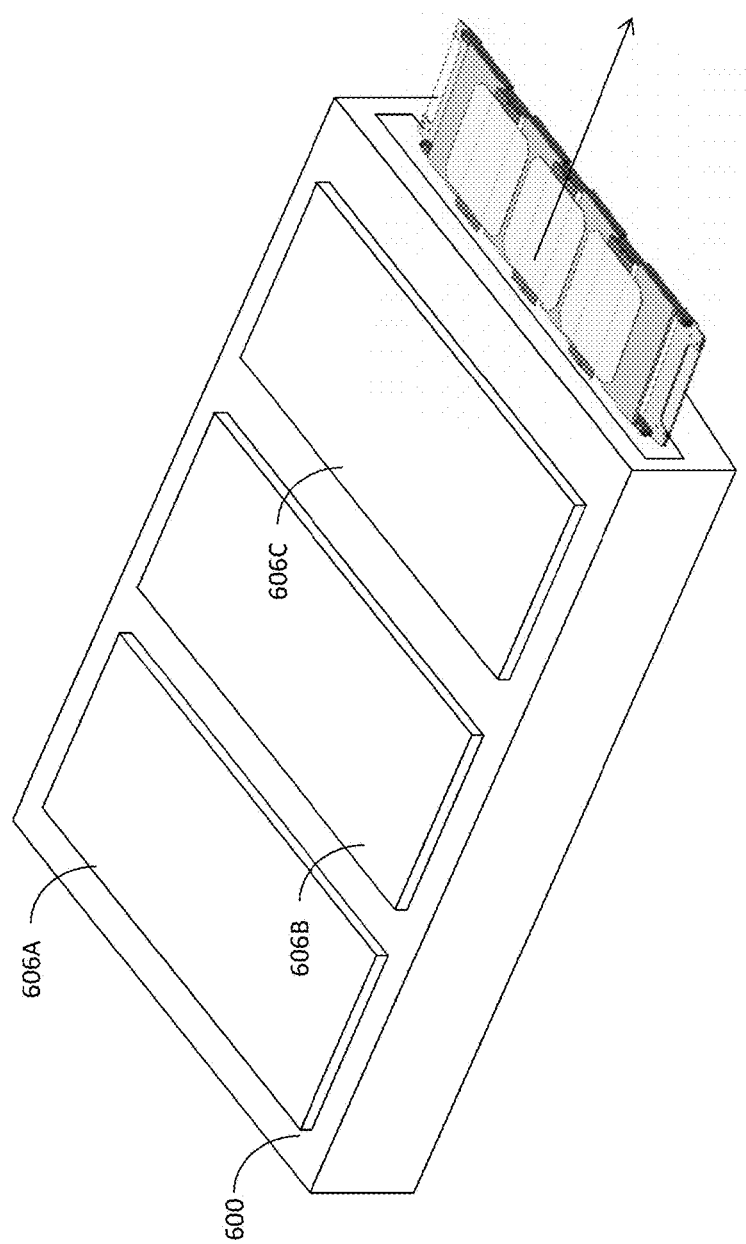

FIGS. 6A-6C illustrate three embodiments demonstrating how the vacuum chamber can be fitted with different processing sources of varying sizes and configurations. In the examples of FIGS. 6A-6C it is assumed that the substrates are arrange three-wide, but of course more or less substrates can be arranged on a carrier widthwise. Also, in FIGS. 6A-6C it is assumed that the processing chamber can accommodate several carriers, e.g., two or three, for simultaneous processing. The sources illustrated in FIGS. 6A-6C may be any processing sources, such as, e.g., PVD, etch, implant, etc.

FIG. 6A illustrates an embodiment wherein a single source 601 is provided on chamber 600. This single source is used to process all of the substrates positioned inside the chamber 600. The source 601 may have length and/or width that covers all of the substrates simultaneously. For some sources, it may be too complicated or too expensive to fabricate a single source with such a large size. For example, if source 601 is a sputtering source, the target must be made very large, which is expensive, complicated, and leads to under-utilization. Therefore, according to the embodiments of FIGS. 6B and 6C several smaller sources are used. In the embodiment of FIG. 6B each of the sources 603A-603C is wide enough to cover only a single substrate, but it may cover more than one substrate lengthwise, i.e., in the direction of substrate travel. By staggering the sources such that each source covers only one of the substrate in each carrier, all of the substrates can be processed. Such an arrangement is particularly suitable for pass-by processing. Conversely, in the embodiment of FIG. 6C each of the sources 606A-606C is wide enough to cover all of the substrates in one carrier, i.e., in a direction perpendicular to the substrate travel direction, but is too narrow to cover all of the substrates positioned within the chamber. In fact, in some embodiments each of the sources 606A-606C is even narrower than one substrate. Such an arrangement is equally suitable for pass-by or static processing.

The embodiments described above provide for a vacuum processing chamber having a vacuum housing sized for housing and processing several substrate carriers simultaneously. The housing is also configured for supporting several processing sources simultaneously. The processing sources may be, e.g., sputtering sources, which may be narrow sources having length sufficient to traverse all substrates held by a substrate carrier, but may be narrower than the width of a substrate positioned on the carrier. Several such sources may be positioned back-to-back over the entire or part of the length of the chamber in the travel direction of the carrier. The chamber has several shafts positioned on two opposing sides to transport the carriers inside the chamber. Each shaft is rotated by a flexible belt that is motivated by a motor. Each shaft has several magnetic wheels positioned thereupon in alternating pole order, i.e., while one wheel may have its outside circumference magnetized south and inside diameter magnetized north, the neighboring wheel would have its outer circumference magnetized north and inside diameter magnetized south. The chamber also has an entry sidewall having an inlet opening and an exit sidewall opposite the entry sidewall and having an outlet opening; wherein a magnetized wheel arrangement is positioned inside the entry sidewall and protruding into the inlet opening and having a magnetized wheel arrangement positioned inside the exit sidewall and protruding into the outlet opening, so as to drive the substrate carriers passing through the inlet and outlet openings.

The disclosed system is a linear system wherein the chambers are arranged linearly, one chamber coupled to the next, such that substrate carriers enter the system from one side, traverse all the chambers in a linear fashion, and exit the system on the opposite side. The carriers move from one chamber directly to the next via valve gates separating the chambers. Once a carrier exits the vacuum environment of the system, it enters an elevator and is moved vertically to a return conveyor, which transport the carrier horizontally back to the entry side of the system, wherein it enters another elevator and is moved vertically to be loaded with fresh substrates and enter the vacuum environment of the system again. While the carrier is transported in atmospheric environment it is held in a horizontal orientation. However, in one embodiment, when the carrier enters the vacuum environment it is rotated to a vertical orientation, such that the substrates are processed while held in a vertical orientation.

The system may have a loading and unloading station positioned at the entry side of the system. The loading and unloading system has a rotating structure upon which four rows of chucks are positioned, two rows on each side of the rotation axis. On each side of the rotation axis one row of chucks is configured for unloading processed substrates and one row of chucks is configured for loading fresh substrates. The rotating structure is configured for vertical motions, wherein when it assumes its lower position the structure picks-up substrates and when it assumes its elevated position the structure rotates 180 degrees. Also, when the structure is in its lowered position, on each side of the rotation axis one row of chucks picks-up substrates while the other row of chucks deposits, i.e., releases, its substrates. In one embodiment, two conveyors are provided across the entry to the system, wherein one conveyor delivers fresh substrates while the other conveyor removes processed substrates. The rotating structure is configures such that in its lower position one row of chucks is aligned with the conveyor delivering fresh substrates while the other row of chucks is aligned with the conveyor removing processed substrates. Simultaneously, on the other side of the rotation axis, one row of chucks is aligned with an empty carrier while the other row of chucks is aligned with a carrier holding processed substrates.

In some embodiments provisions are made to apply potential to the substrates. Specifically, each carrier includes a conductive strip that, when the carrier enters a processing chamber, is inserted into a sliding contact comprising an elongated contact brush and a conformal insulating spring that is configured to press the conductive strip against the elongated contact brush. An insulating strip, such as a Kapton strip, can be used to attach the conductive strip to the carrier.

When processing of the substrates requires the use of masks, the masks may be placed individually on top of each substrate, or one mask may be formed to cover all substrates of one carrier simultaneously. The mask may be held in place using, e.g., magnets. However, for accurate processing the mask must be made very thin, and consequently may deform due to thermal stresses during processing. Additionally, a thin mask may collect deposits rapidly and the deposits may interfere with the accurate placing and masking of the mask. Therefore, it would be advantageous to use the dual-mask arrangement according to the embodiments disclosed below.

FIGS. 7A-7E illustrate views of a multi-wafer carrier (linearly arranged in this example) having an arrangement for dual-mask, according to various embodiments. FIG. 7A illustrates a multi-wafer carrier with dual-masks arrangement, wherein the mask arrangement is in the lower position such that the inner mask is in intimate physical contact with the wafer; FIG. 7B illustrates a multi-wafer carrier with dual-masks arrangement, wherein the mask arrangement is in the elevated position thereby enabling replacement of the wafers; FIG. 7C illustrates a multi-wafer carrier with dual-masks arrangement, wherein wafer lifters are included for loading/unloading wafers (wafers are omitted from this illustration); FIG. 7D illustrates a partial cross-section of a multi-wafer carrier with dual-masks arrangement, wherein the mask arrangement and the wafer lifters are in the elevated position; and FIG. 7E illustrates a partial cross-section of a multi-wafer carrier with dual-masks arrangement, wherein the mask arrangement and the wafer lifter are in the lower position.

Referring to FIG. 7A, the multi-wafer carrier, also referred to as carrier support 700 has three separate single-wafer carriers or susceptors 705, which are supported by a susceptor frame or bars 710, made of, e.g., ceramic. Each single-wafer carrier 705 is configured for holding a single wafer together with a dual-mask arrangement. In FIG. 7A the dual-mask arrangement is in a lowered position, but no wafer is situated in any of the carriers, so as to expose the carriers' construction. In FIG. 7B the dual-mask arrangement is shown in the lifted position, again without wafers in any of the carriers. In the embodiments of FIGS. 7A-7E a lifter 715 is used to lift and lower the dual-mask arrangement; however, for lower cost and less complication, lifter 715 may be eliminated and the dual-mask arrangement may be lifted manually. Also, a mask lifting arrangement can be provided in the load/unload station. Transport rails 725 are provided on each side of the frames 710, to enable transporting the carrier 700 throughout the system.

Each of single-wafer carriers 705 has a base 730 (visible in FIG. 7B), which has a raised frame 732 with a recess 735 to support a wafer suspended by its periphery. The base 730 with the frame 732 form a pocket 740 below the suspended wafer, which is beneficial for capturing broken wafer pieces. In some embodiments, the frame 732 is separable from the base 730. Outer mask 745 is configured to be mounted on the frame 732, so as to cover the frame 732 and cover the periphery of the inner mask, but expose the central part of the inner mask which corresponds to the wafer. This is exemplified by the cross-section illustration in the embodiment of FIG. 8.

In FIG. 8, base or susceptor 805 has raised frame 832 with recess 835, which supports wafer 820 at its periphery. The base 830 with frame 832 forms pocket 840, and the wafer 820 is suspended above the pocket. A series of magnets 834 are positioned inside the raised frame 832, so as to surround the periphery of the wafer 820. In some embodiments, especially for high temperature operations, the magnets 834 may be made of Samarium Cobalt (SmCo) Inner mask 850 is positioned on top of the raised frame 832 and the wafer 820, and is held in place by magnets 834, such that it physically contacts the wafer. Outer mask 845 is placed over and physically contacts the inner mask 850, such that it covers the periphery of the inner mask 850, except for the area of the inner masks that is designed for imparting the process to the wafer. An example of outer mask 945 is shown in FIG. 9, in this example made of a folded (e.g., stamped) sheet of aluminum, wherein the inner mask is covered by the outer mask, except for a small peripheral edge 952, since the example is for an edge shunt isolation processing. An example of the inner mask 750 for edge shunt isolation is illustrated in FIG. 10, which is basically a flat sheet of metal having an aperture of size and shape as that of the wafer, except that it is slightly smaller, e.g., 1-2 mm smaller than the size of the wafer. In the embodiment of FIG. 8, mask frame 836 is provided to enable supporting and lifting of the inner and outer mask off of the carrier. In such a configuration, the outer mask 845 is sandwiched between the mask frame 836 and the inner mask 850.

FIG. 8A illustrates another embodiment, which may be used, for example, for forming contact patterns on the back of a wafer. In this embodiment, the susceptor forms a top platform to support the wafer on its entire nack surface. Magnets 834 are embedded over the entire area of the suscpetor below the top surface of the susceptor. The inner mask 850 covers the entire surface of the wafer 820 and has plurality of holes according to the contact design.

Turning back to FIGS. 7A-7E, lifter 715 can be used to raise the outer mask, together with the inner mask. Also, wafer lifter 752 can be used to lift the wafer off of the frame 730, so that it could be replaced with a fresh wafer for processing, using a robot arm. However, lifters 715 and 752 can be eliminated and the operations of lifting the masks and replacing the wafer may be done manually, or by other means, instead.

In the embodiments described above with reference to FIG. 8, the carrier supports the wafer on its peripheral edge, such that the wafer is suspended. The pocket formed below the wafer traps broken wafer pieces and prevents wrap-around of deposited material. On the other hand, in the embodiment of FIG. 8A the wafer is supported over its entire surface. The mask assembly is lowered in place for sputter or other form of processing, and is lifted, manually or mechanically, for loading and unloading of wafers. A series of magnets on the carrier help secure the inner mask in place and in tight contact with the wafer. After repeated uses, the outer and inner masks can be replaced, while the rest of the carrier assembly can be reused. The frame 710, also referred to as mask assembly side bars, may be made from low thermal expansion material, such as Alumina or Titanium.

According to the above embodiments, the inner mask establishes an intimate gap free contact with the substrate. The outer mask protects the inner mask, the carrier and the carrier frame from deposited material. In the embodiments illustrated, the outer and inner mask openings are in a pseudo-square shape, suitable for applications to mono-crystalline solar cells during edge shunt isolation process. During other processes the inner mask has a certain apertures arrangement, while the outer mask has the pseudo-square shaped aperture. Pseudo-square shape is a square with its corners cut according to a circular ingot from which the wafer was cut. Of course, if poly-crystalline square wafers are used, the outer and inner mask openings would be square as well.

FIG. 11 illustrate an embodiment of the single wafer susceptor 1105, corresponding to the embodiment of FIG. 8. The wafer rests at its periphery on recess 1132. Magnets 1134, shown in broken line, are provided inside the carrier all around the wafer. Alignment pins 1160 are used to align the outer mask to the susceptor 1105. An embodiment of the outer mask is shown in FIG. 12, viewing from the underside. The outer mask 1245 is fabricated by stamped sheet metal. It has alignment holes or recesses 1262 corresponding to the alignment pins 1260 of the carrier 1205. The outer mask 1245 is configured to cover and protect the susceptor.

FIG. 13 illustrates an embodiment of a top frame 1336 used to hold the outer and inner masks and secure the masks to the susceptor. The top frame 1336 may be made by, e.g., two longitudinal bars 1362, held together by two traverse bars 1364. The outer mask is held inside pocket 1366. Alignment holes 1368 are provided to align the top frame to the susceptor.

Figure 15:
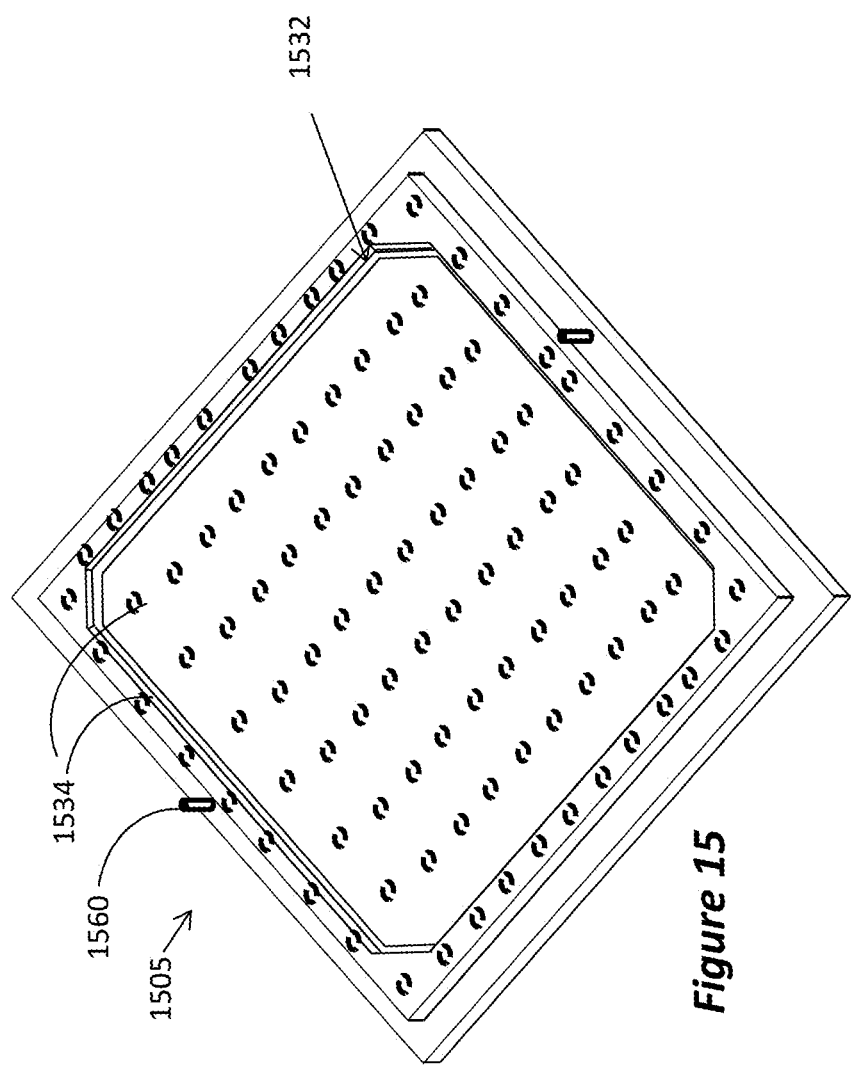
FIG. 15 illustrates an embodiment of the susceptor for use with the mask of FIG. 9.

FIG. 14 illustrates an example of an inner mask with a hole-pattern designed, for example, for fabricating plurality of contacts on the wafer. Such an inner mask can be used with the susceptor shown in FIG. 15, wherein the magnets 1534 are distributed over the entire area below the surface of the wafer. The magnets are oriented in alternating polarization.

An upper or outer mask may be made from thin, e.g., about 0.03", aluminum, steel or other similar material, and is configured to mate with a substrate carrier. An inner mask is made from a very thin, e.g., about 0.001 to 0.003", flat steel sheet, or other magnetic materials, and is configured to be nested within the outer mask.

According to further embodiments, arrangement for supporting wafers during processing is provided, comprising: a wafer carrier or susceptor having a raised frame, the raised frame having a recess for supporting a wafer around periphery of the wafer and confining the wafer to predetermined position; an inner mask configured for placing on top of the raised frame, the inner mask having an aperture arrangement configured to mask part of the wafer and expose remaining part of the wafer; and an outer mask configured for placing over the raised frame on top of the inner mask, the outer mask having a single opening configured to partially cover the inner mask. A top frame carrier may be used to hold the inner and outer mask and affix the inner and outer masks to the wafer susceptor.

Magnets are located in the susceptor and alternate N-S-N-S-N completely around the frame or completely below the entire surface of the susceptor and directly under the wafer. The outer and inner masks are designed to be held to the frame by magnetic forces only, so as to enable easy and fast loading and unloading of substrates.

The mask assembly is removable from the wafer carrier and support frame to load the substrate into the carrier. Both the outer and inner masks are lifted as part of the mask assembly. Once the wafer is located on the carrier in the wafer pocket, the mask assembly is lowered back down onto the carrier. The inner mask overlaps the top surface of the wafer. The magnets in the carrier frame pull the inner mask down into intimate contact with the substrate. This forms a tight compliant seal on the edge of the wafer. The outer mask is designed in order to prevent deposition on the thin compliant inner mask and on the susceptor. As explained above, the deposition process might cause the inner mask to heat, causing the mask to warp and loose contact with the wafer. If the mask looses contact with the wafer the metal film will deposit in the exclusion zone on the surface of the substrate wafer. The pocket and friction force created by the magnets keep the substrate and mask from moving relative to each other during transport and deposition, and the outer mask prevents film deposition on the inner mask and prevents the inner mask from warping.

The mask assembly can be periodically removed from the system with the carrier by use of a vacuum carrier exchange. The carrier exchange is a portable vacuum enclosure with carrier transport mechanism. It allows the carriers to be exchanged "on the fly" without stopping the continuous operation of the system.

Figure 16:
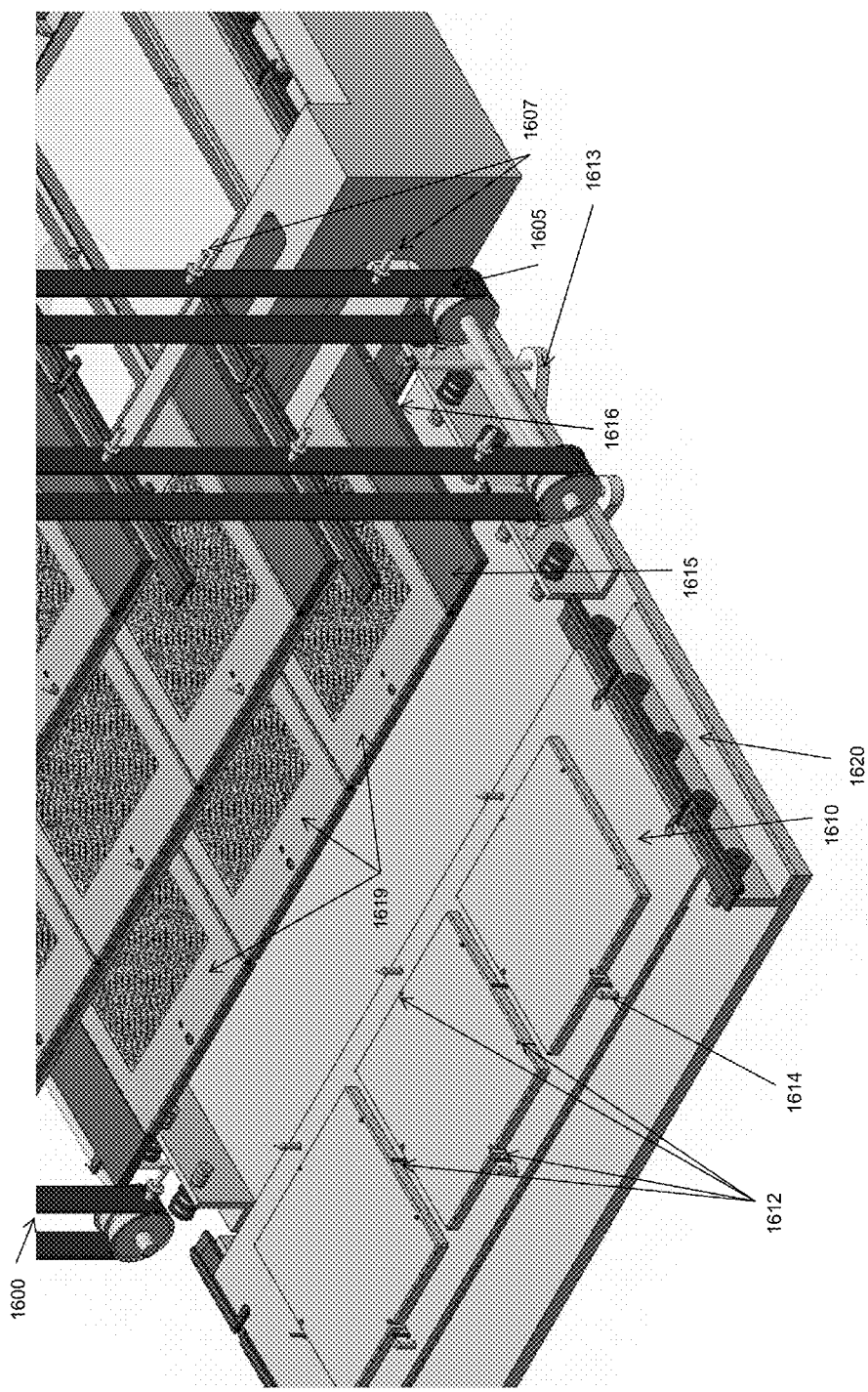
FIG. 16 illustrates an embodiment of a carrier elevator that may be used with various embodiments of the system disclosed herein.

As disclosed above, in certain embodiments the carriers are returned in atmospheric environment, for example, on a conveyor above the vacuum processing chambers. In such embodiments, the carriers can be lifted and/or lowered using an elevator. FIG. 16 illustrates an embodiment of a carrier elevator that may be used with various embodiments of the system disclosed herein. The elevator 1600 is constructed rather simply and inexpensively, in part due to the simplified design of the carriers. In general, the elevator 1600 is constructed by implementing a vertically moving conveyor belt or chain, 1605, which has pins 1607 extending orthogonally to the direction of travel therefrom. As the conveyor 1605 moves, the pins 1607 engage and lift the carriers 1610.

In FIG. 16, carrier 1610 is shown without substrates or masks on load/unload or buffer station 1620. If used for loading, buffer station 1620 has substrate alignment mechanism which, in this embodiment, includes substrate alignment pins 1612 which extend through openings in the carrier 1610. In this embodiment, once the substrates are aligned on top of the carrier, the substrates may be chucked and the alignment pins 1612 may be lowered and the carrier travels without the pins 1612. Also, if a masking scheme is used, mask alignment pins 1614 extend through openings in the carrier and the masks so as to align the masks to each substrate individually. Once aligned, the mask alignment pins 1614 can be disengaged such that the carrier travels without the mask alignment pins 1614.

This elevator arrangement can be implemented in systems that do or do not use masks over the substrates. As shown in the example of FIG. 16, the carrier 1610 is moved into the conveyor station 1600 and a mask lifter 1613 engages and lifts the mask assembly 1615 off of the carrier 1610. The carrier 1610 is then moved to load/unload station 1620 wherein processed substrates are removed and fresh substrates are loaded. In FIG. 16 the carrier 1610 is illustrated after processed substrates have been removed, but before fresh substrates have been loaded. Alignment pins 1614 extend at the load/unload station to ensure proper alignment of the substrates on the carrier 1610. Then the pins 1614 are lowered and the carrier is returned to the conveyor station 1600. If no mask is used, the conveyor 1605 is then moved up so that the pins of the conveyor engage and lift the carrier and deliver it to the next stage in the process sequence.

Conversely, when masks are used, after the carrier 1610 is delivered to the conveyor 1600, the mask lifter 1613 then lowers the mask assembly 1615 to deposit the mask assembly 1615 back over the carrier 1610. In FIG. 16 the mask assembly includes a main frame 1616 and three individual masks 1619. The carrier is then returned to the load station 1620 and the mask alignment pins 1614 are raised so as to align each mask to the corresponding individual substrate. The mask alignment pins 1614 can then be lowered and the carrier 1610 can be moved to the next step in the process.

Figure 17:
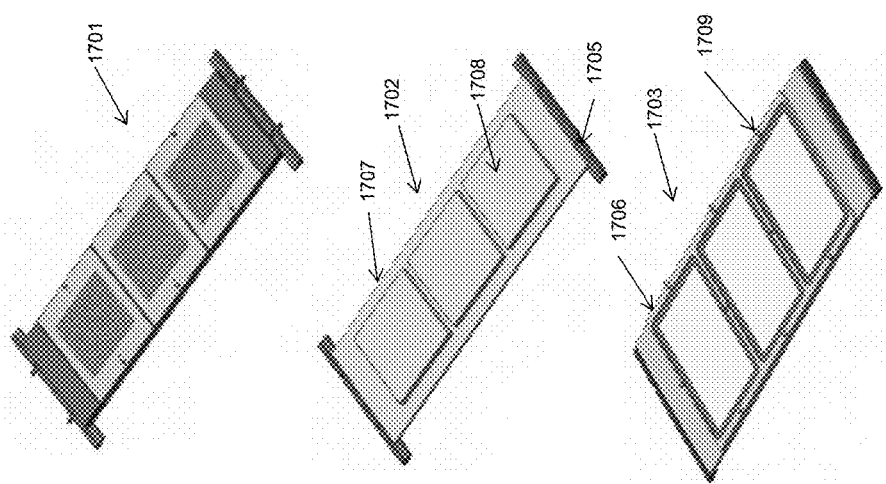
FIG. 17 illustrates an embodiment of a carrier that may be used with different size and different types of substrates in the same processing system.

FIG. 17 illustrates an embodiment of a universal carrier that may be used with different sizes and different types of substrates in the same processing system, or a system having the same architecture as disclosed herein, except that the chamber sizes may be changed to accommodate different size substrates. This feature enables the reuse of as many common elements as possible, even when the chamber size needs to be changed. For example, the entire carrier transport system, including the elevator, can be identical, using the same parts for any size system. Use of the same parts reduces the overcall cost of the system due to economies of scale.

In the example of FIG. 17, the universal carrier is illustrated in three different configurations: carrier 1701 is configured to accept masks for fabrication of, e.g., solar cells; carrier 1702 is a carrier without a mask and may be during, e.g., ion implantation or etching; and carrier 1703 is configured for supporting glass substrates for fabrication of, e.g., touch panels for cellphones or pads. All three carriers can be used with the same transport system, such that they may be used in the same processing system. For this objective, the carrier comprises a common rail 1705 that is the same for all carriers, e.g., carriers 1701, 1702, and 1703, and is designed to engage with the transport mechanism and the elevator, when used. A carrier body is designed specifically for each application, and it is attached to the common rail 1705. Also, each carrier body has a specific substrate attachment mechanism that fits the particular substrate used for the application, e.g., silicon wafers for solar cells or glass for touch screens. For example, carrier body 1707 has bases 1708 configured to accept substrate thereupon. The bases 1708 may be, e.g., a simple susceptor, an electrostatic chuck, etc. Conversely, body 1706 has clips 1709 designed to engage the substrate, such as, e.g., glass panels.

Figure 18:
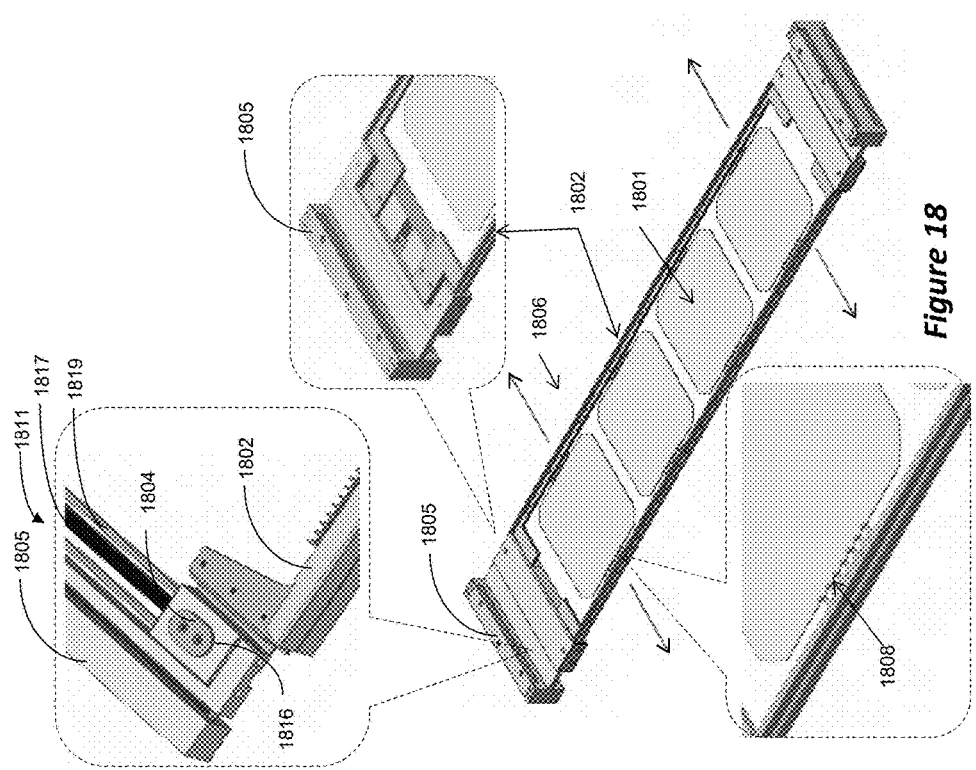
FIG. 18 illustrates an embodiment of a dual-sided flip carrier that may be used with different size and different types of substrates in the same processing system.

FIG. 18 illustrates an embodiment of a dual-sided flipable carrier that may be used with different sizes and different types of substrates in the same processing system. As shown, the carrier may be formed using common rails 1805, similar to that in the embodiment of FIG. 17. The carrier body 1806 is made of simple sliding rails 1802 that may be made of inexpensive sheet metal. In some embodiments the sliding rails 1802 may be spring loaded to be normally in the closed position, i.e., the position engaging the substrates 1801. To load substrates, the sliding rails 1802 are slid to the open position, as illustrated by the double-lined arrows, the substrates 1801 are positioned between the clips 1808, and the rails 1802 are allowed to return to close position, thereby holding the substrates 1801 at the edges, fully exposing both surfaces of the substrates 1801.

The top callout in FIG. 18 illustrates an embodiment of an actuator mechanism for a universal carrier that may be used with different sizes and different types of substrates in the same processing system, whether in horizontal or vertical orientation. The universal carrier has a traveling rail 1805 at each edge for engaging a transport mechanism. An actuator 1811 is provided on each rail 1805, the actuator 1811 is configured for opening and closing the elongated sidebars 1802 using a sliding operation, as shown by the arrows. The actuator 1811 also locks the sidebars 1802 in place at the desired opening size—depending on the width of the substrate. Each of the sidebars 1802 has substrate retaining clips 1808. Also, for vertical processing each sidebar may also have support clips (obscured from view by the substrates 1801 in FIG. 18). The actuator 1811 comprises carrier clamps 1804, which are made of magnetic material, such as, e.g., 400 series magnetic stainless steel, so that they can be actuated with electromagnets. A clamp bar 1817 has grooved surface and engages grooved surface on bottom of the carrier clamp 1804 to lock the clamp in a desired place. Springs (hidden from view) push the carrier clamps into contact with the clamp bar. A slide block 1816 has linear bearings for riding on the linear rails 1819 providing slide block motion.

With respect to the embodiment of FIG. 18, the loading operation is as follows. A horizontal empty carrier moves to the load position. The carrier is always loaded and unloaded in a horizontal orientation, regardless of whether the processing is done in horizontal or vertical orientation. Four electromagnets (not shown—provided on the system's chamber) engage the four carrier clamps 1804 and are energized, thereby lifting or disengaging the clamps 1804 from the clamp bar 1817. Electromagnets on four independent linear slides open the carrier side walls 1802. The substrates 1801 are lifted between the carrier side rails 1802. The substrates are lifted into a carrier where the side walls or sidebars 1802 are opened wider than the width of the substrates. The sidebars 1802 are then moved to desired position to retain the substrates by the clips 1808 and are then locked firmly in place by the actuator 1811. For example, the electromagnets on the four independent linear slides close the carrier side walls 1802 by moving in to a fixed distance, such that the spring clips 1808 hold the substrates at their edges. The operator would have chosen the panel size from the user interface. The electromagnets are de-energized, allowing the carrier clamps 1804 to engage the clamp bar 1817. This firmly holds the carrier side rails at the required distance for the selected panel size. The loaded carrier moves to a buffer area where it can be moved to vertical orientation for processing if vertical processing is desired. Another empty carrier moves to load and the process repeats. The unloading process is essentially the reverse of the above steps.

Figure 19A:
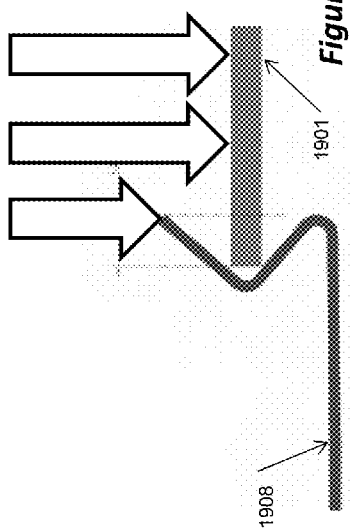
FIGS. 19A and 19B illustrate an embodiment of a simple substrate clip that can be used in a dual-sided flip carrier for different size and different types of substrates.
Figure 19B:
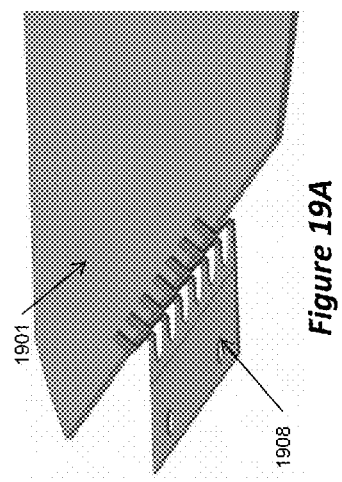

FIGS. 19A and 19B illustrate an embodiment of a simple substrate clip 1908, which can be used in a dual-sided flip carrier for different size and different types of substrates 1901. The clip can be manufactured inexpensively from sheet metal. When used for fabrication of thin substrates, such as, e.g., solar cells, the clips are configured so as not to exert pressure on the substrate. That is, in close position the opening between the clips equals the width of the held substrate.

One feature of the clips is that they are self-shadowing. This feature is particularly important when the fabrication includes deposition of material on the substrate. As seen in FIG. 19B, the clips have an "S-shape" wherein the top of the S curve faces the direction of deposited material. The arrows in FIG. 19B illustrate the deposition material reaching the substrate 1901, but not the interior part of the S-curve of the clip. Consequently, the interior of the clip does not accumulate deposition material, such that it prevents deposition material particles from falling on subsequent substrates.

Figure 20A:
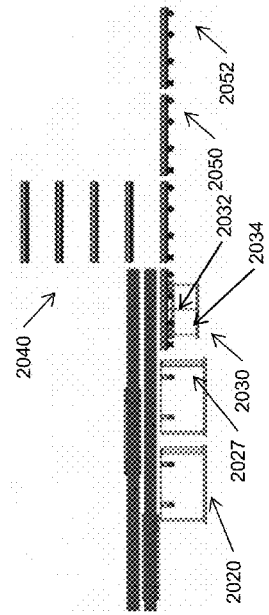
FIGS. 20A and 20B illustrate an embodiment of a loading and unloading module that can be used with various systems as disclosed herein.
Figure 20B:
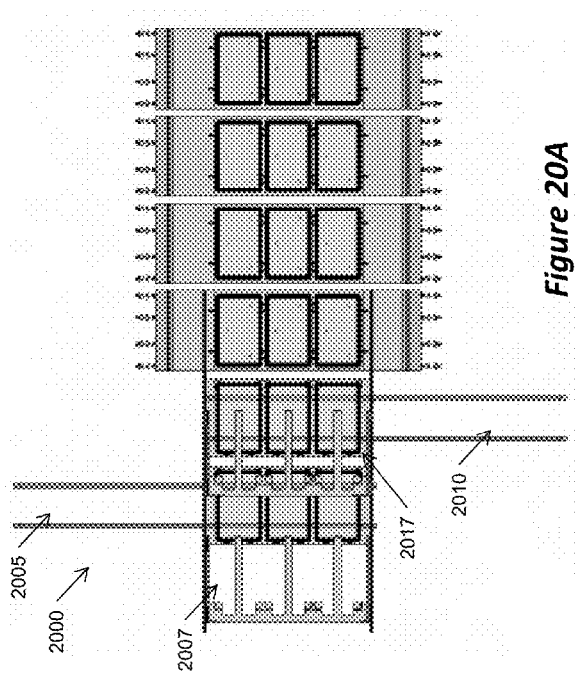

FIGS. 20A and 20B illustrate an embodiment of automation arrangement for loading and unloading substrates from carriers. The load/unload module 2000 has an incoming substrate conveyor 2005, outgoing substrate conveyor 2010, substrate load robot blade 2007, substrate unload robot blade 2017, incoming substrate lift 2020 and outgoing substrate lift 2027, substrate load/unload station 2030, optional carrier actuator 2032, carrier lift pins 3034, carrier return lift 2040, which may be configured as the lift illustrated in FIG. 16, two carrier buffers 2050 and 2052, with optional tilt mechanism if required for vertical processing. Each of the carrier buffers are positioned inside a carrier load lock (not shown) and is situated on the other side of the elevator than the loading station. That is, the elevator is positioned such that the load station is on one side and the buffer station is on the opposite side of the elevator.

As a carrier enters the unloading station 2030, the substrate unload robot blade 2017 lifts the substrates from the carrier. The carrier then moves to the loading station, while the unloading robot blade 2017 lowers the substrates onto outgoing substrate conveyor 2010. Meanwhile, incoming robot blade 2007 removes fresh substrates from incoming substrate conveyor 2005 and loads them onto the now-empty carrier. The loaded carrier then moves into the lift to be sent back to the system for processing.

Figure 21:
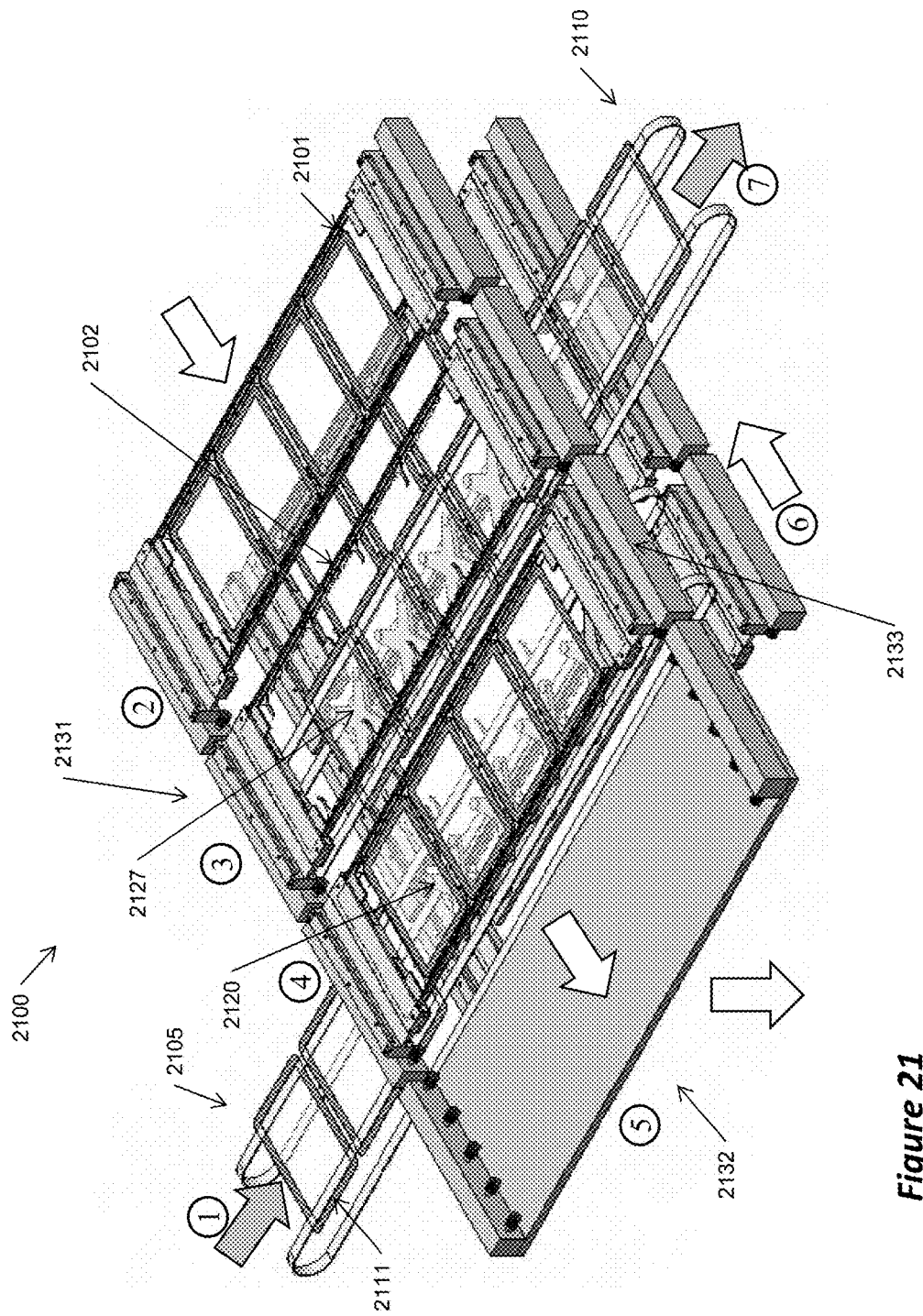
FIG. 21 illustrates an embodiment of automation arrangement for loading and unloading substrates from carriers.

FIG. 21 illustrates another embodiment of a loading and unloading module that can be used with various systems as disclosed herein. This simplified load/unload station uses no robots and no robot blades. Also, the design of this station enables loading and unloading substrates without touching the front surface or the sides of the substrates. Only the rear surface is contacted at a few points. The embodiment of FIG. 21 is illustrated with the adjustable carrier of FIG. 18; however, the mechanism that opens and closes the sliding rails is obscured. By using the carrier of FIG. 18, different sizes of substrates can be processed by simple software change and no hardware change. That is, all that is required is to change the software to indicate a different opening and closing width of the sliding rails to accommodate different size substrates. The entire system remains the same.

The load/unload station 2100 includes incoming substrate conveyor 2105, outgoing substrate conveyor 2110, incoming substrate lift 2120 positioned under the incoming substrates conveyor 2105, and outgoing substrate lift 2127 positioned under the outgoing substrates conveyor 2110. A carrier actuator 2132 lowers carriers from upper position to lower position. The substrate carriers moves in the direction illustrated by the unfilled arrows, while the conveyors/substrates move in the direction indicated by the filled arrows.

The exchange of substrates is done according to the following process, wherein the enumerated steps are indicated in FIG. 21 by circled numerals. In step 1 the incoming substrates 2111 are delivered by advancing the incoming substrate conveyor 2105 one pitch. One pitch equals the cumulative length of all of the substrates positioned on one carrier. In step 2, a carrier 2101 with processed substrates is returning from the processing system. In step 3 the carrier 2101 is positioned at the carrier unload station 2131. At this position the unload substrates lift 2127 is raised to engage the processed substrates, the sliding rails 2102 of the carrier are extended to the open position so as to release the substrates to the unload substrates lift 2127, and the unload substrates lift 2127 is lowered so as to deposit the processed substrates onto the outgoing substrate conveyor 2110. At step 4 the carrier is then moved to the load station 2133, the sliding rails still being in the open position. In this position the load carrier lift 2120 lifts fresh substrates to position the substrates such that the sliding rails can be closed to engage the substrates with clips. If vertical processing is used, the substrates are positioned such that the bottom edge lines up just above bottom edge support for vertical operation. Once the sliding rails close and engage the substrates with the clips, the load carrier lift 2120 can be lowered. The carrier is then moved to carrier elevator 2132 in step 5, and the elevator moves the carrier with the fresh incoming substrates to the lower row. The carrier is then moved in step 6 into a load lock (not shown) or onto a tilt buffer for vertical operation. Meanwhile, as indicated by step 7, the outgoing substrates conveyor 2110 is activated to move one pitch, so as to remove the processed substrates from the system.

The sequence of operation of the automation arrangement for loading and unloading substrates from carriers in an embodiment of FIG. 21 can be summarized as follows. After the last processing step and exiting vacuum, the upper row of carriers shift one step left. The load conveyor belt shifts substrates into load position, while the unload conveyor belt shifts substrates away from the unload station (after having processed substrates deposited thereupon). The sliding rails of the loaded and the empty carriers are opened, such that the loaded carrier releases the processed substrates to the unload lifters, while the substrate lifters at the load conveyor raise fresh substrates into position until the substrates are clipped into the carrier. Meanwhile, the carrier elevator drops to lower row position to lower an already loaded carrier. At this stage the substrate lifters position the bottom edge of the substrates per operator designated substrate width. This is done by selecting positions using a user interface to the system's controller. As the unload carrier opens so that the unload lifters can remove the processed substrates, the load carrier closes to capture the fresh substrates, and the lower row of carries shift one position to the right, i.e., towards the system. The load carrier closes per operator designated substrate width. Then, the substrate lifters lower and the carrier elevator rise in preparation for the next loaded carrier. The sequence then repeats.

FIG. 22 illustrates an embodiment of substrate carrier arrangement that can be processed in a horizontal or vertical orientation, while FIG. 23 illustrates the arrangement of FIG. 22 in a vertical placement. Specifically, the common rails 2205 incorporate a bar 2209 made of paramagnetic material. The system is equipped with row of magnetized rollers 2267 on each side of processing chambers, such that the carriers are magnetically attached to the rollers. This provides at least two benefits. First, when the rollers are rotated, there's no slippage between the roller rotation and motion of the carrier, so that carrier motion can be tightly controlled. Second, as illustrated in FIG. 23, for vertical processing the rollers are provided on top and bottom of the processing chamber, and the carriers are still magnetically attached to the rollers, but in vertical orientation. In vertical orientation, a bottom roller 2269 is added to support and guide the bottom rail of the carrier. Also, a shield 2224 is provided so as to prevent any particles generated from the roller mechanism contaminating the substrates. The shield 2224 includes an extension 2226 that is configured to be housed inside a corresponding cavity 2228 that is provided in the common rails. The extension 2226 basically wraps around the bar 2209, such that the bar 2209 is situated between the roller 2267 and the extension 2226.

The carrier of FIGS. 22 and 23 comprises basically of two common rails 2205 and a planar panel 2207 attached to the rails. The planar panel 2207 includes clips, such as those illustrated in the callout, so as to hold the substrates in place. The panel 2207 may be solid panel, in which case the clips may simply urge the substrates against the solid panel. Conversely, the panel 2207 may have cutouts formed like the interior of a picture frame, wherein the substrates are urged against a lip of the cutout, just like a picture glass is urged against the frame.

FIG. 24 illustrates an embodiment of substrate carrier arrangement that can be flipped so as to process both surfaces of the substrates. As illustrated in FIG. 24, each common rail 2405 has two bars 2409 made of magnetic material—one on top and one on bottom of the common rail. The body 2407 of the carrier has clear cut outs, each cut out sized to be larger than the substrate, such that a space exists between the periphery of the substrate and the edge of the cut out. This can be seen more clearly in the dashed-dot callout of FIG. 24. Clips 2408 hold the substrate within the cut out. In this manner, both front and back surfaces of the substrate are exposed. The carrier is fabricated to be symmetrical and hold the substrates in the center, such that in effect there is no front and back, but simply two sides, wherein either side provides equal access to the surface of the substrate.

Figure 25:
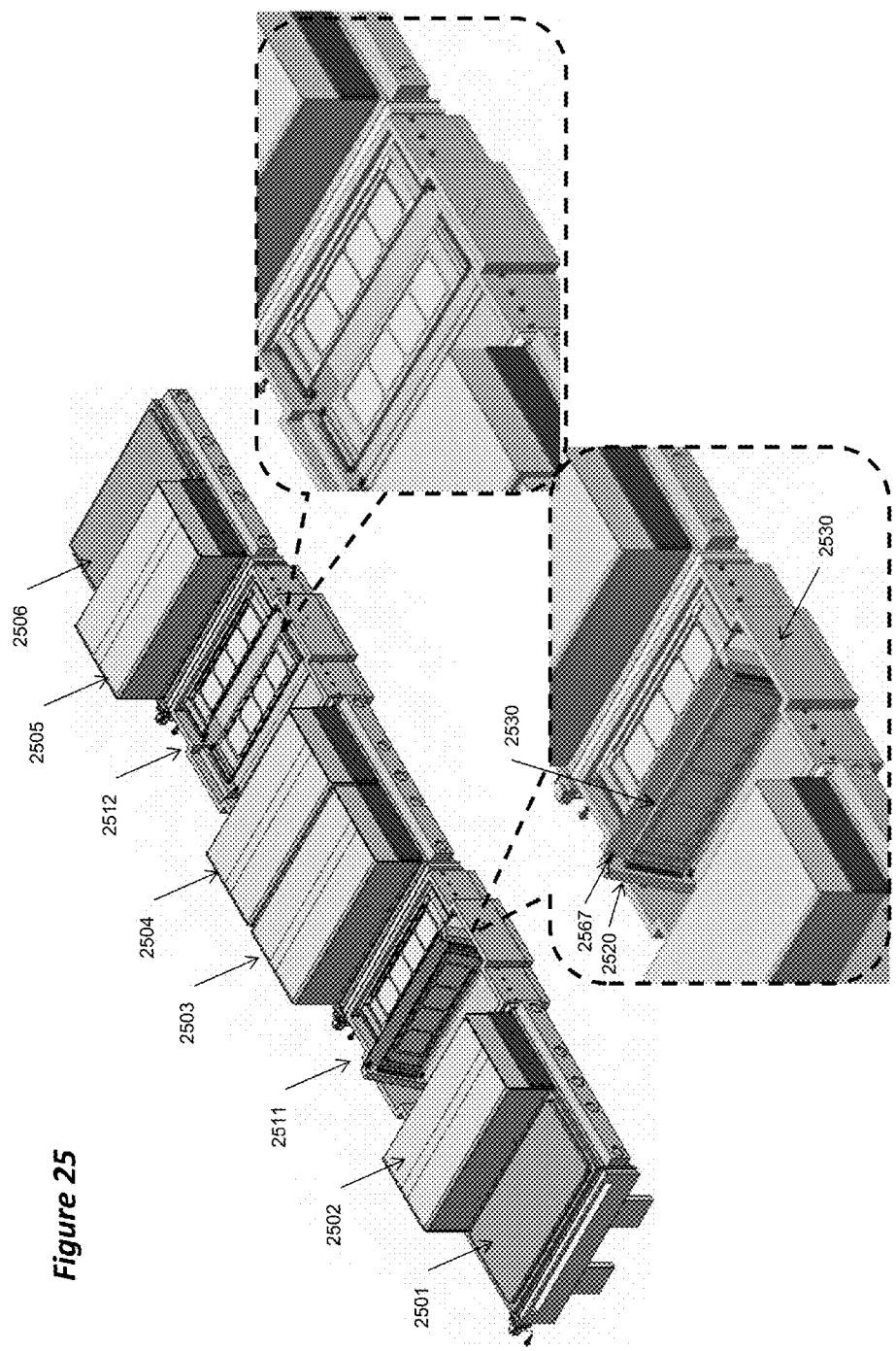
FIG. 25 illustrates an embodiment of a system wherein the substrate carrier arrangement can be flipped so as to process both surfaces of the substrates.

FIG. 25 illustrates an embodiment of a system wherein the substrate carrier arrangement can be flipped so as to process both surfaces of the substrates. The carrier illustrated in FIG. 24 can be advantageously used in this system. This embodiment illustrates a system wherein the carriers are flipped in vacuum; however, if desired, the same arrangement can be used to flip the carriers in atmosphere. Flipping the carrier in vacuum is preferred when successive processes steps should be performed without breaking vacuum in between. In the particular example of FIG. 25 two flipping stations are illustrated as an example, but fewer or more flipping stations may be used. In the system of FIG. 25, the carrier with the substrates traverses a first processing chamber 2501 and a second processing chamber 2502. For example, in chamber 2502 a metal layer may be deposited on one surface of the substrate.

The carrier then moves into the first flipping station 2511. In the flipping station the carrier moves into a rotatable cradle 2520. Cradle 2520 has magnetized wheel arrangement 2567, such that the carrier is held in place. The cradle is then rotated about axis 2530. Again, since the carriers are magnetically held by the magnetized rollers 2567, the cradle 2520 assembly with the carrier 2530 can be rotated and the carrier would be help upside-down by the magnetic force of the rollers. The carrier 2530 then moves to the next station within the flipping station, wherein the rollers are below the carrier, so that the carrier now presents the other surface of the substrates. The substrates remain clipped to the carrier throughout this process.

Once flipped, the carrier moves into the next processing station 2503. For example, a metal layer can now be deposited on the other surface of the substrates. In this particular example, the carrier then moves to yet another processing chamber 2504. This may be, for example, a second metal layer over the first metal layer. The carrier may then move to another flipping station or, if processing is completed, the second flipping station may be omitted and the carrier moved to a load/unload station.

While this invention has been discussed in terms of exemplary embodiments of specific materials, and specific steps, it should be understood by those skilled in the art that variations of these specific examples may be made and/or used and that such structures and methods will follow from the understanding imparted by the practices described and illustrated as well as the discussions of operations as to facilitate modifications that may be made without departing from the scope of the invention defined by the appended claims.

The invention claimed is:

1. A system for processing substrates in vacuum processing chambers, comprising:
a plurality of carriers, each carrier configured for supporting and transporting substrates throughout the system and inside the vacuum processing chambers;
each of the carriers comprising clips for holding substrates while exposing both surfaces of each substrate;
each of the carriers comprising two paramagnetic common rails at each end thereof;
a plurality of magnetized rollers for transporting the carriers throughout the system, by engaging and magnetically holding the common rails;
a flip station comprising a rotatable frame coupled to a rotating axis, and wherein a subset of the plurality of magnetized rollers is positioned on each end of the frame; and,
wherein each of the carries further comprises two sliding rails configured for holding different substrates of different sizes.

2. The system of claim 1, wherein each of the carries is configured for supporting a linear array of 1×n substrates, wherein n is an integer larger than 1.

3. The system of claim 1, wherein the sliding rails are spring-loaded in close position.

4. The system of claim 1, wherein the carriers are transported inside the vacuum processing chambers in a vertical orientation thereby carrying the substrates in a vertical orientation.

5. The system of claim 1, further comprising a conveyor for returning carriers to the loading station after completion of processing.

6. The system of claim 5, wherein the conveyor passes above the vacuum processing chambers in atmospheric environment.

7. The system of claim 1, further comprising a carrier elevator coupled a loading/unloading station.

8. The system of claim 7, wherein the carrier elevator comprises a plurality of vertically oriented conveyor belts, each conveyor belt having a plurality of pins extended to engage the common rails.

9. The system of claim 7, wherein the loading/unloading station comprises an incoming substrate conveyor, an outgoing substrate conveyor, a substrate load lifter, substrate unload lifter, and carrier actuator configured for actuating the carrier to release its substrates.

10. The system of claim 9, further comprising mask loading mechanism for loading masks onto the carriers.

11. The system of claim 9, wherein the loading/unloading station comprises an upper carrier transport and a lower carrier transport spaced vertically below the upper carrier transport, and wherein the incoming substrate conveyor and the outgoing substrate conveyor pass in a space positioned vertically between the upper carrier transport and the lower carrier transport.

12. The system of claim 7, wherein the loading/unloading station further comprises retractable substrate alignment pins configured to align substrates loaded onto the carriers.

13. A system for processing substrates in vacuum processing chambers, comprising:
a plurality of carriers, each carrier configured for supporting and transporting substrates throughout the system and inside the vacuum processing chambers;
each of the carriers comprising clips for holding substrates while exposing both surfaces of each substrate;
each of the carriers comprising two paramagnetic common rails at each end thereof;
a plurality of magnetized rollers for transporting the carriers throughout the system, by engaging and magnetically holding the common rails;
a flip station comprising a rotatable frame coupled to a rotating axis, and wherein a subset of the plurality of magnetized rollers is positioned on each end of the frame; and,
wherein each of the plurality of magnetized rollers comprises a rotating shaft having a plurality of magnetic wheels attached thereto in alternating magnetic polarity.

14. The system of claim 13, wherein each of the shafts it rotated by a flexible tension element.

15. The system of claim 14, wherein the flexible tension element comprises a belt or a chain.

16. A universal carrier that may be used with different sizes and different types of substrates, comprising:

two traveling rails, one at each edge for engaging a transport mechanism;
two elongated sidebars, each connected to the traveling rails at the edge thereof;
a plurality of retaining clips provided on the sidebars and configured for engaging an edge of a substrate for holding the substrate without touching any surface of the substrate;
two actuators provided on each traveling rail, each actuator configured for opening and closing a corresponding sidebar using a sliding operation;
a locking mechanism provided on the actuator to lock the corresponding sidebar in a desired slide position; and,
wherein the actuator comprises carrier clamps made of magnetic material.

17. The universal carrier of claim 16, further comprising a plurality of support clips provided on the sidebars.

18. The universal carrier of claim 16, wherein the actuator further comprises clamp bar that has grooved surface and engages grooved surface on bottom of the carrier clamp to lock the clamp in a desired place.

19. The universal carrier of claim 18, wherein the actuator further comprises springs configured to push the carrier clamps into contact with the clamp bar.

20. The universal carrier of claim 19, wherein the actuator comprises a slide block having linear bearings for riding on linear rails.

21. The universal carrier of claim 16, wherein the actuator comprises a slide block having linear bearings for riding on linear rails.

* * * * *